(12) United States Patent
Kim et al.

(10) Patent No.: US 10,096,618 B2
(45) Date of Patent: Oct. 9, 2018

(54) METHODS OF FABRICATING THREE-DIMENSIONAL SEMICONDUCTOR DEVICES

(71) Applicants: Ki-Woong Kim, Seoul (KR); Hyo-Jung Kim, Hwaseong-si (KR); Kieun Seo, Suwon-si (KR); Ki Hoon Jang, Hwaseong-si (KR); Byoungho Kwon, Hwaseong-si (KR); Boun Yoon, Seoul (KR)

(72) Inventors: Ki-Woong Kim, Seoul (KR); Hyo-Jung Kim, Hwaseong-si (KR); Kieun Seo, Suwon-si (KR); Ki Hoon Jang, Hwaseong-si (KR); Byoungho Kwon, Hwaseong-si (KR); Boun Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/642,829

(22) Filed: Jul. 6, 2017

(65) Prior Publication Data

US 2018/0090512 A1 Mar. 29, 2018

(30) Foreign Application Priority Data

Sep. 23, 2016 (KR) .................. 10-2016-0122389

(51) Int. Cl.
*H01L 21/3205* (2006.01)
*H01L 27/11582* (2017.01)
(Continued)

(52) U.S. Cl.
CPC ...... *H01L 27/11582* (2013.01); *H01L 21/283* (2013.01); *H01L 21/31053* (2013.01);
(Continued)

(58) Field of Classification Search
None
See application file for complete search history.

(56) References Cited

U.S. PATENT DOCUMENTS 6,146,975 A 11/2000 Kuehne et al.
6,326,309 B2 12/2001 Hatanaka et al.
(Continued)

FOREIGN PATENT DOCUMENTS

JP 2000-036533 A 2/2000
JP 2006-049684 A 2/2006

*Primary Examiner* — Bradley K Smith
(74) *Attorney, Agent, or Firm* — Ward and Smith, P.A.

(57) ABSTRACT

A method of fabricating a three-dimensional semiconductor device is provided. The method includes providing a substrate with a peripheral circuit region and a cell array region; forming a peripheral structure on the peripheral circuit region, and forming an electrode structure on the cell array region. The electrode structure includes a lower electrode, a lower insulating planarized layer on the lower electrode, and upper electrodes and upper insulating layers vertically and alternatingly stacked on the lower insulating planarized layer, and the lower insulating planarized layer may be extended to cover the peripheral structure on the peripheral circuit region. An upper insulating planarized layer is formed to cover the electrode structure and the lower insulating planarized layer on the peripheral circuit region.

20 Claims, 30 Drawing Sheets

(51) Int. Cl.
  *H01L 21/283*    (2006.01)
  *H01L 21/3105*   (2006.01)
  *H01L 27/1157*   (2017.01)
  *H01L 27/11573*  (2017.01)
  *H01L 21/02*     (2006.01)
  *H01L 27/24*     (2006.01)

(52) U.S. Cl.
  CPC .... *H01L 27/1157* (2013.01); *H01L 27/11573* (2013.01); *H01L 21/02636* (2013.01); *H01L 27/249* (2013.01); *H01L 27/2436* (2013.01)

(56) References Cited

U.S. PATENT DOCUMENTS

| | | |
|---|---|---|
| 6,562,679 B2 | 5/2003 | Lee et al. |
| 8,633,104 B2 | 1/2014 | Pyo et al. |
| 8,735,967 B2 | 5/2014 | Lim et al. |
| 8,871,103 B2 | 10/2014 | Busch et al. |
| 9,324,710 B2 | 4/2016 | Leobandung |
| 9,691,781 B1 * | 6/2017 | Nishikawa et al. ......... H01L 27/11573 |
| 2007/0045724 A1 | 3/2007 | Lim et al. |
| 2012/0108048 A1 | 5/2012 | Lim et al. |
| 2016/0049423 A1 | 2/2016 | Yoo et al. |
| 2016/0293625 A1 * | 10/2016 | Kang ................ H01L 27/11582 |
| 2017/0148977 A1 * | 5/2017 | Shin ................. H01L 27/76889 |

* cited by examiner

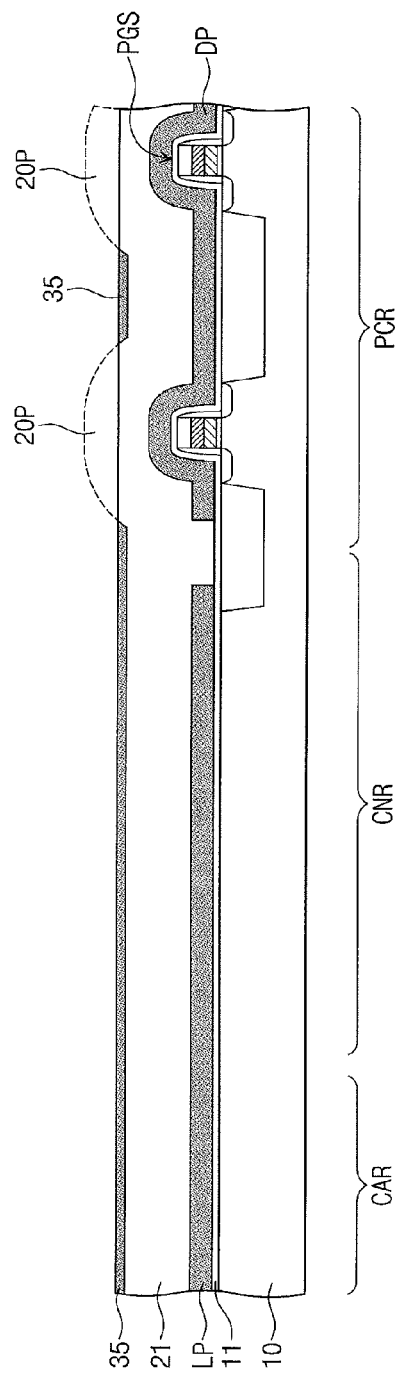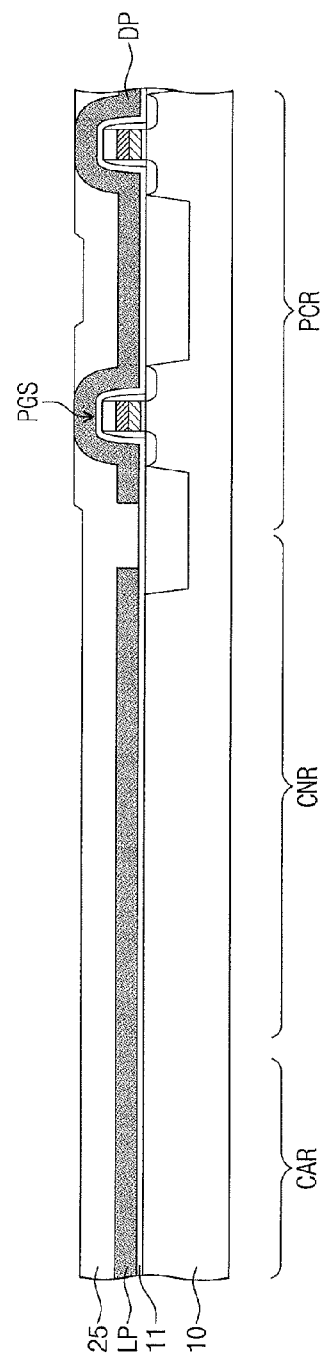

METHODS OF FABRICATING THREE-DIMENSIONAL SEMICONDUCTOR DEVICES

CROSS-REFERENCE TO RELATED APPLICATION

This U.S. non-provisional patent application claims priority under 35 U.S.C. § 119 to Korean Patent Application No. 10-2016-0122389, filed on Sep. 23, 2016, in the Korean Intellectual Property Office, the entire contents of which are hereby incorporated herein by reference.

FIELD

The present disclosure relates generally to semiconductor devices and, more particularly, to three-dimensional semiconductor devices and related methods of fabricating three-dimensional semiconductor devices.

BACKGROUND

Higher integration of semiconductor devices is required to satisfy consumer demands for superior performance and cost restrictions. Since integration is an important factor in determining product prices, increased integration is desired. In the case of two-dimensional or planar semiconductor devices, integration is mainly determined by the area occupied by a unit memory cell and, thus, integration is greatly influenced by the level of a fine pattern forming technology. However, expensive process equipment needed to increase pattern fineness sets a practical limitation on increasing integration for two-dimensional or planar semiconductor devices. To address these issues, three-dimensional semiconductor memory devices including three-dimensionally arranged memory cells have been proposed.

SUMMARY

Some embodiments of the inventive concept provide methods of fabricating a highly-integrated semiconductor device. Methods of fabricating a three-dimensional semiconductor device include providing a substrate with a peripheral circuit region and a cell array region; forming a peripheral structure on the peripheral circuit region of the substrate; sequentially forming a lower sacrificial layer and a lower insulating layer to cover the peripheral structure and the cell array region of the substrate and to have a protruding portion on the peripheral structure; forming an etch stop pattern to cover a top surface of the lower insulating layer on the cell array region and to expose the protruding portion of the lower insulating layer; performing a planarization process, in which the etch stop pattern is used as an etch stop layer, on the protruding portion of the lower insulating layer to form a lower insulating planarized layer; removing the etch stop pattern; and forming a mold structure on the cell array region. The mold structure includes upper sacrificial layers and upper insulating layers that are vertically and alternatingly stacked on the lower insulating planarized layer.

Further embodiments of the inventive concept provided methods of fabricating a three-dimensional semiconductor device including providing a substrate with a peripheral circuit region and a cell array region; forming a peripheral structure on the peripheral circuit region of the substrate; and forming an electrode structure on the cell array region of the substrate. The electrode structure includes a lower electrode, a lower insulating planarized layer on the lower electrode, and upper electrodes and upper insulating layers vertically and alternatingly stacked on the lower insulating planarized layer, and the lower insulating planarized layer is extended to cover the peripheral structure on the peripheral circuit region. After the formation of the electrode structure, an upper insulating planarized layer is further formed to cover the electrode structure and the lower insulating planarized layer on the peripheral circuit region.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 25 to 31 are cross-sections illustrating processing steps in the fabrication of three-dimensional semiconductor memory devices according to some embodiments of the inventive concept.

DETAILED DESCRIPTION OF EMBODIMENTS

Figure 1:
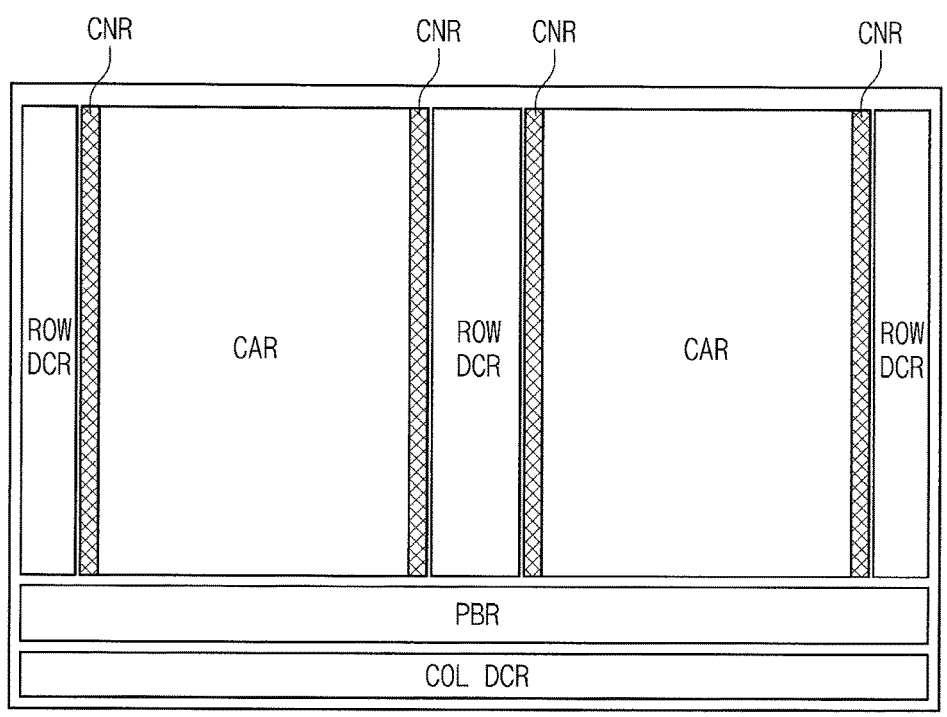
FIG. 1 is a plan view illustrating a schematic configuration of a three-dimensional semiconductor memory device according to some embodiments of the inventive concept.

Hereinafter, the inventive concept will be described in detail by explaining example embodiments of the inventive concept with reference to the attached drawings. Like reference numerals in the drawings denote like elements and, thus, detailed descriptions thereof will be omitted in the interest of brevity.

The inventive concept may be embodied in many different forms and should not be construed as limited to the example embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

Furthermore, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment can be embodied in a different manner, a specified process order may be performed in a different manner. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. As used herein, the term "and/or" includes any and all combinations of one or more of the associated listed items. Expressions such as "at least one of," when preceding a list of elements, modify the entire list of elements and do not modify the individual elements of the list. A terminology such as "substrate" may denote a substrate itself, or a stack structure including a substrate and predetermined layers or films formed on a surface of the substrate. Furthermore, a terminology "surface of substrate" may denote an exposed surface of the substrate itself, or an external surface of a predetermined layer or a film formed on the substrate.

Referring now to FIG. 1, a plan view illustrating a schematic configuration of a three-dimensional semiconductor memory device according to some embodiments of the inventive concept will be discussed. As illustrated in FIG. 1, a three-dimensional semiconductor memory device may include a cell array region CAR and a peripheral circuit region PCR. The peripheral circuit region PCR may include row decoder regions ROW DCR, a page buffer region PBR, a column decoder region COL DCR, and a control circuit region (not shown). In some embodiments, a connection region CNR may be provided between the cell array region CAR and each of the row decoder regions ROW DCR.

A memory cell array including a plurality of memory cells may be provided in the cell array region CAR. In some embodiments, the memory cell array may include a plurality of memory cells, which are three-dimensionally arranged in the memory cell array, and a plurality of word and bit lines, which are electrically connected to the memory cells.

In each of the row decoder regions ROW DCR, a row decoder may be provided to select at least one of the word lines that are provided in the memory cell array, and in the connection region CNR, an interconnection structure may be provided to electrically connect the memory cell array to the row decoder. The row decoder may be configured to select at least one of the word lines, based on address information. The row decoder may be configured to apply different word line voltages to selected and unselected ones, respectively, of the word lines, in response to control signals from a control circuit (not shown).

In the page buffer region PBR, a page buffer may be provided to read out data stored in the memory cells. Depending on an operation mode, the page buffer may be configured to temporarily store data in the memory cells or to read out data stored in the memory cells. For example, the page buffer may function as a write driver in a program operation mode or as a sense amplifier in a read operation mode.

A column decoder may be provided in the column decoder region COL DCR and may be connected to the bit lines of the memory cell array. The column decoder may provide data-transmission paths between the page buffer and an external device, for example, a memory controller.

Figure 2:
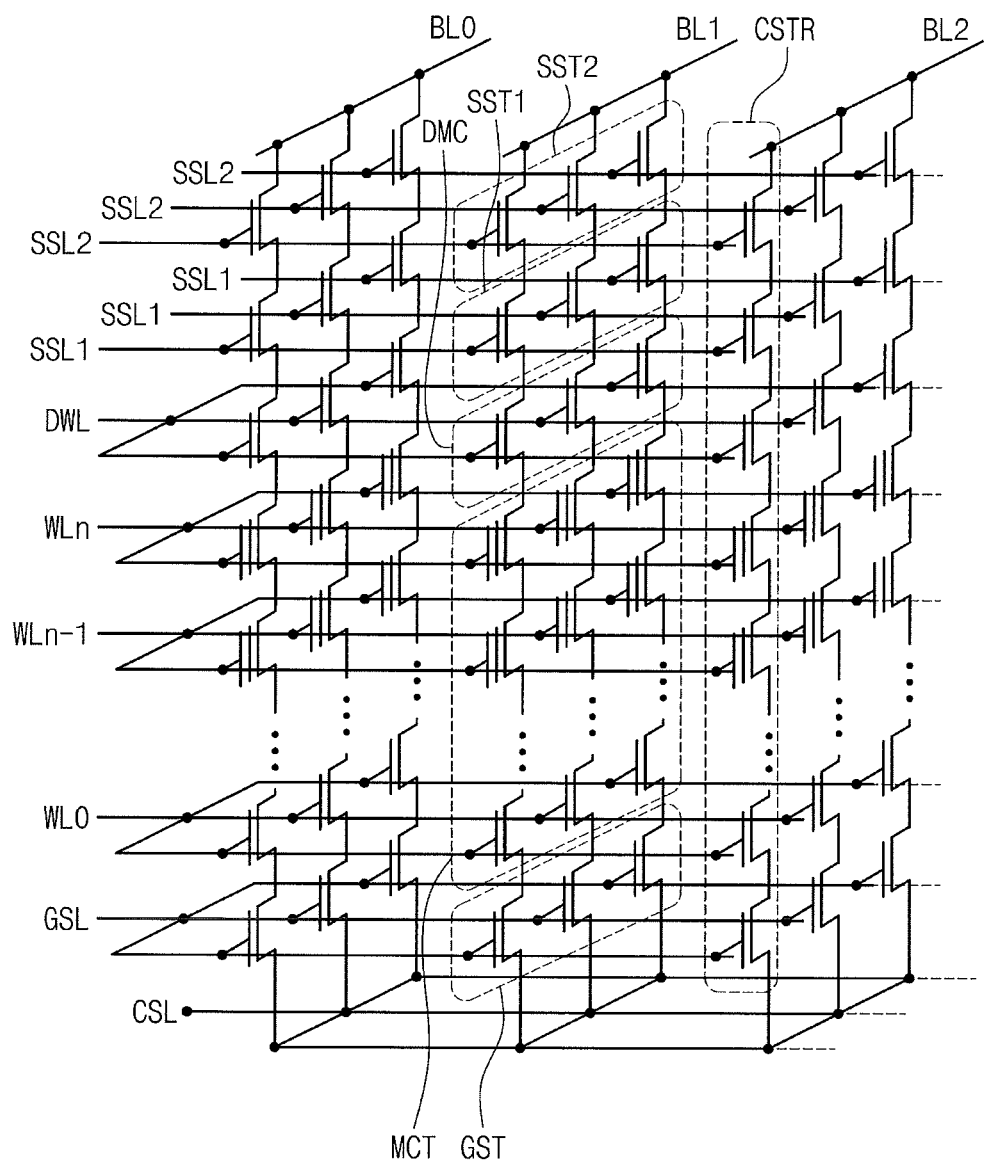
FIG. 2 is a circuit diagram of a three-dimensional semiconductor memory device according to some embodiments of the inventive concept.

Referring now to FIG. 2, a circuit diagram of a three-dimensional semiconductor memory device according to some embodiments of the inventive concept will be discussed. As illustrated in FIG. 2, a three-dimensional semiconductor memory device according to some embodiments of the inventive concept may include a cell array, in which a common source line CSL, a plurality of bit lines BL0-BL2, and a plurality of cell strings CSTR therebetween are provided.

The bit lines BL0-BL2 may be two-dimensionally arranged, and a plurality of cell strings CSTR may be connected in parallel to each of the bit lines BL0-BL2. The plurality of cell strings CSTR may be connected in common to the common source line CSL. In other words, a plurality of cell strings CSTR may be provided between the bit lines BL0-BL2 and the common source line CSL. In some embodiments, a plurality of common source lines CSL may be two-dimensionally arranged. The common source lines CSL may be applied with the same voltage or may be independently controlled.

In some embodiments, each of the cell strings CSTR may include a plurality of string selection transistors SST1 and SST2, which are connected in series to each other, memory cells MCT, which are connected in series to each other, and a ground selection transistor GST. Each of the memory cells MCT may include a data storage element.

As an example, each of the cell strings CSTR may include first and second string selection transistors SST1 and SST2, the second string selection transistor SST2 may be coupled to the bit lines BL0-BL2, and the ground selection transistor GST may be coupled to the common source line CSL. The memory cells MCT may be provided between the first string selection transistor SST1 and the ground selection transistor GST and may be connected in series to each other.

Furthermore, each of the cell strings CSTR may further include a dummy cell that is provided between the first string selection transistor SST1 and the memory cell MCT to connect them to each other. Although not shown in the drawings, the dummy cell may be provided between the ground selection transistor GST and the memory cell MCT to connect them to each other.

As another example, in each of the cell strings CSTR, the ground selection transistor GST may include a plurality of metal-oxide-semiconductor (MOS) transistors, which are connected in series to each other, similar to the string selection transistors SST1 and SST2. Furthermore, each of the cell strings CSTR may be configured to have a single string selection transistor.

The first string selection transistor SST1 may be controlled by a first string selection line SSL1, and the second string selection transistor SST2 may be controlled by a second string selection line SSL2. The memory cells MCT may be controlled by a plurality of word lines WL0-WLn, and the dummy cells may be controlled by a dummy word line DWL. The ground selection transistor GST may be controlled by a ground selection line GSL. The common source line CSL may be connected in common to sources of the ground selection transistors GST.

Since each cell string CSTR includes the plurality of memory cells MCT that are positioned at different heights from the common source lines CSL, the word lines WL0-WLn and DWL may have a multi-layered structure between the common source lines CSL and the bit lines BL0-BL2.

Furthermore, gate electrodes of the memory cells MCT, which are disposed at the substantially same height from the common source lines CSL, may be connected in common to one of the word lines WL0-WLn and DWL, thereby being in an equipotential state. IN some embodiments, although the gate electrodes of the memory cells MCT are disposed at the substantially same height from the common source lines CSL, some of them, for example, disposed in a different row or column, may be independently controlled.

Figure 3:
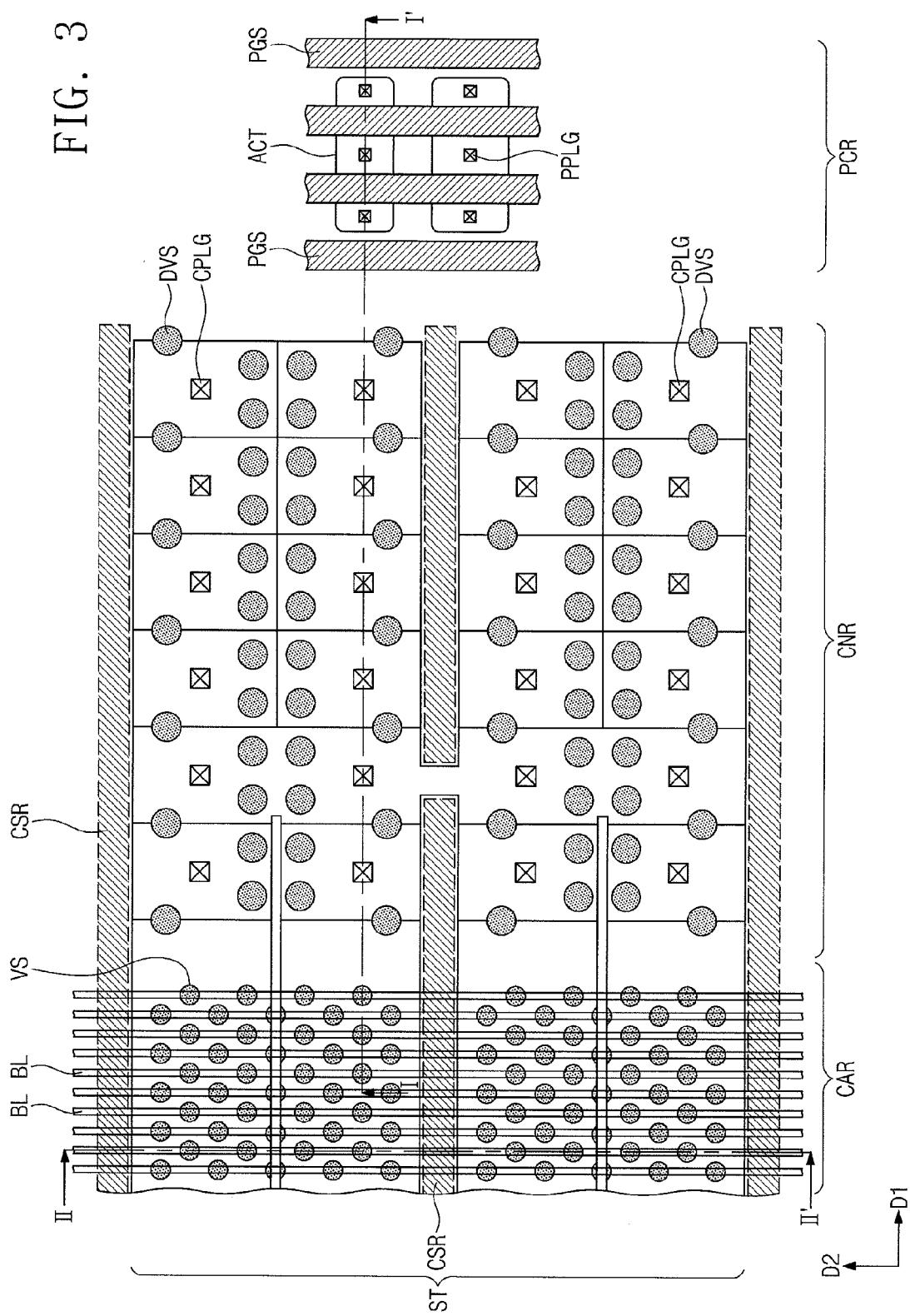
FIG. 3 is a plan view of a three-dimensional semiconductor memory device according to some embodiments of the inventive concept.
Figure 20:
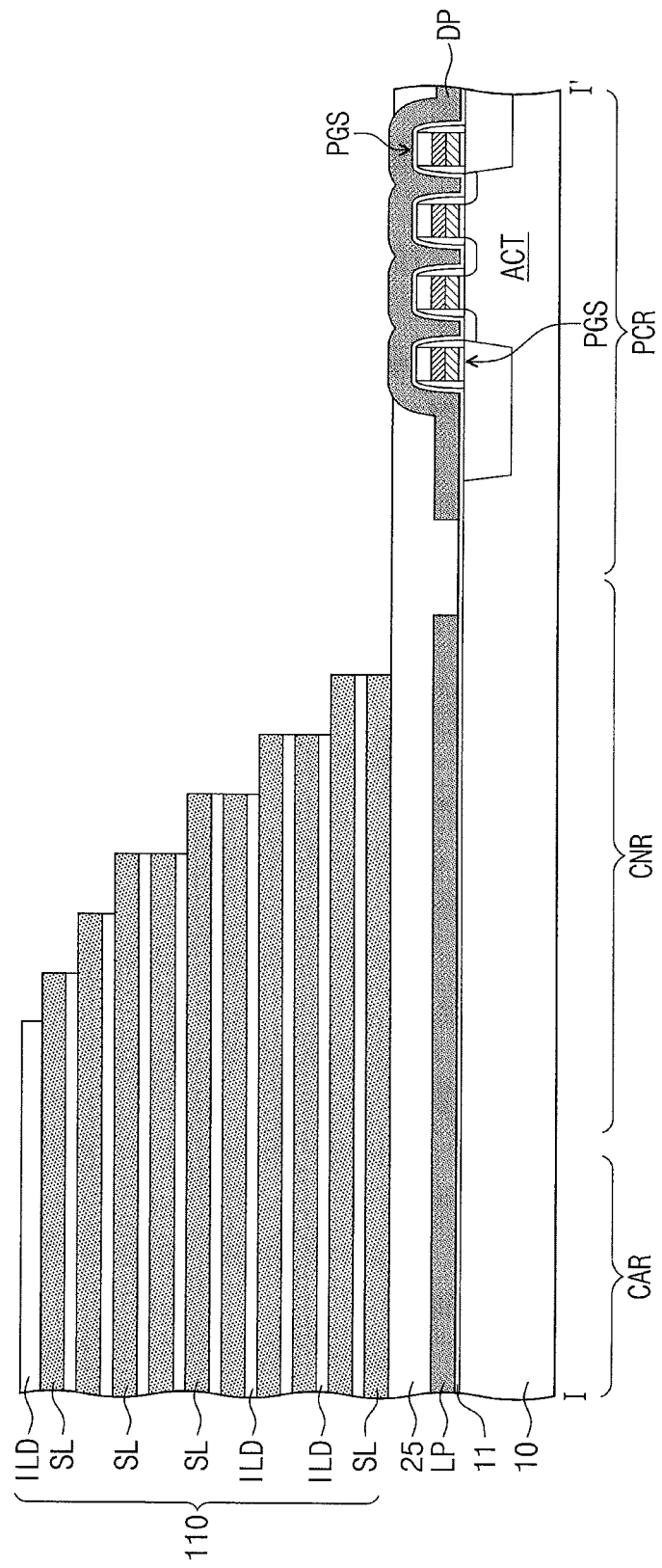
Figure 21:
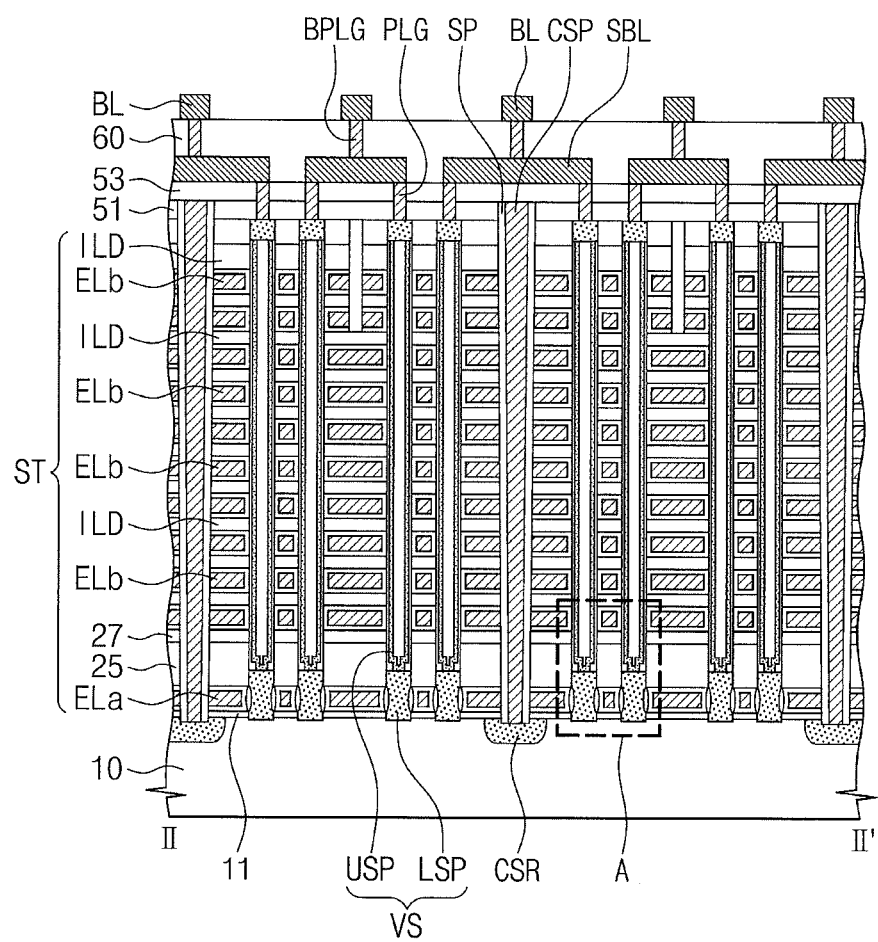
FIG. 21 is a cross-section illustrating a three-dimensional semiconductor memory device according to some embodiments of the inventive concept.
Figure 22:
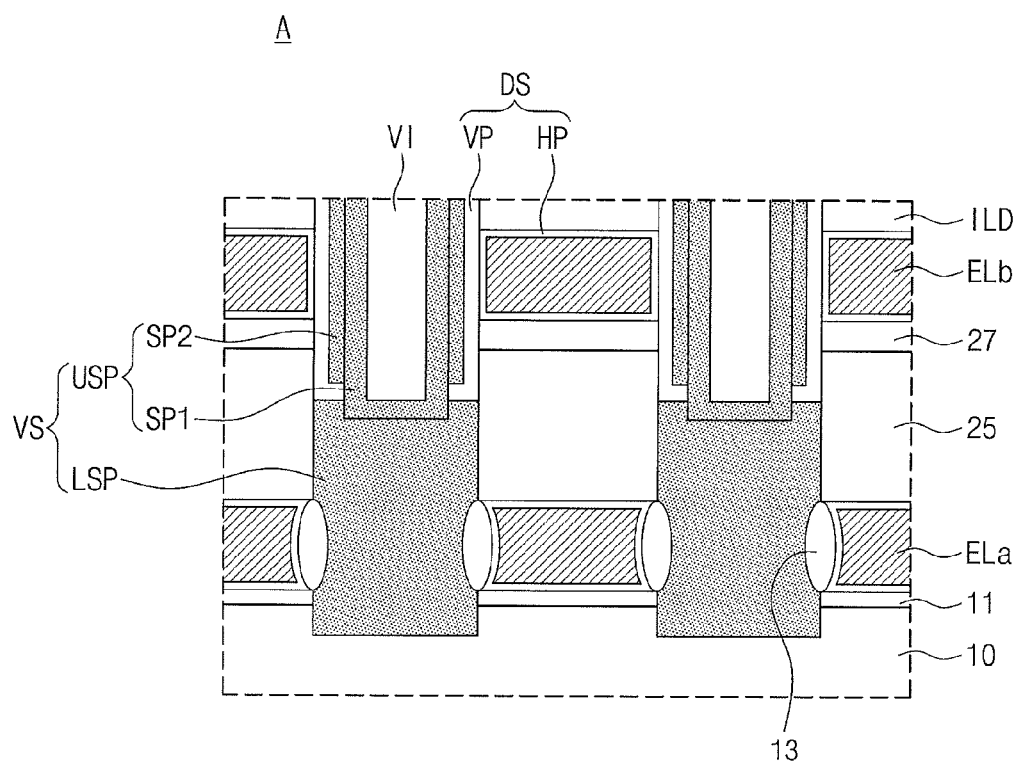
FIG. 22 is an enlarged view of a portion 'A' of FIG. 21.

FIG. 3 is a plan view of a three-dimensional semiconductor memory device according to some embodiments of the inventive concept. FIGS. 4 to 20 are cross-sections illustrating processing steps in the fabrication of three-dimensional semiconductor memory devices according to some embodiments of the inventive concept. For example, FIGS. 4 to 20 are cross sections taken along line I-I' of FIG. 3. FIG. 21 is a cross-section illustrating a three-dimensional semiconductor memory device according to some embodiments of the inventive concept. For example, FIG. 21 is a section view taken along line II-II' of FIG. 3. FIG. 22 is an enlarged view of a portion 'A' of FIG. 21.

Figure 4:
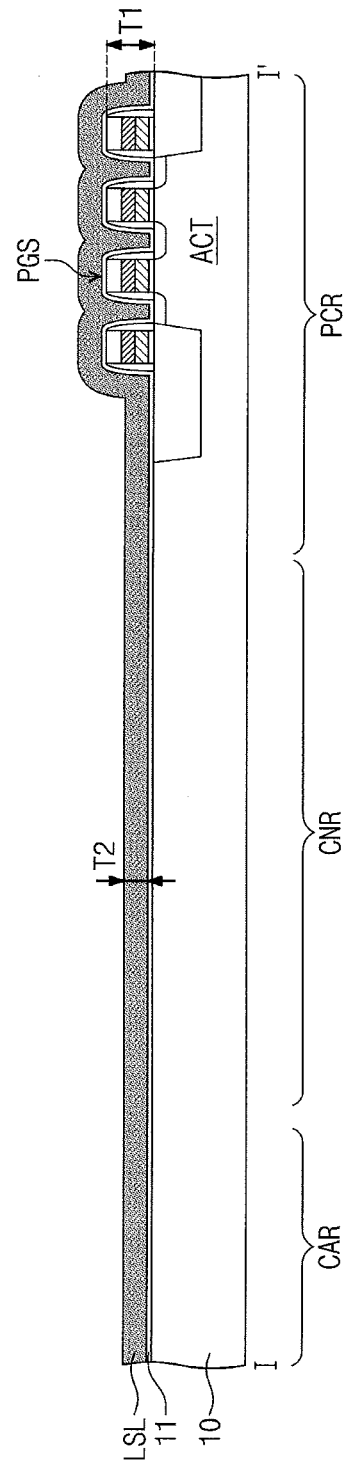
FIGS. 4 to 20 are cross-sections illustrating processing steps in the fabrication of three-dimensional semiconductor memory devices according to some embodiments of the inventive concept.

Referring to FIGS. 3 and 4, a substrate 10 may include a cell array region CAR, a connection region CNR, and a peripheral circuit region PCR. The connection region CNR may be positioned between the cell array region CAR and the peripheral circuit region PCR.

The substrate 10 may include at least one of a semiconductor material such as silicon, an insulating material such as glass, or a semiconductor or conductive material covered with an insulating material. For example, the substrate 10 may be a silicon wafer, which is of a first conductivity type.

A peripheral structure may be formed on the peripheral circuit region PCR of the substrate 10. The peripheral structure may include row and column decoders, a page buffer, and control circuits, which are used to write and read data to and from memory cells, as described with reference to FIG. 1. In other words, the peripheral structure may include NMOS and PMOS transistors, resistors, and capacitors, which are electrically connected to the memory cells.

In particular, the peripheral structure may include peripheral gate stacks PGS that are provided on the peripheral circuit region PCR of the substrate 10 and are spaced apart from each other. The peripheral gate stacks PGS may be provided to cross an active region ACT formed in the peripheral circuit region PCR of the substrate 10. In these embodiments, the peripheral gate stacks PGS may include a gate insulating layer, a poly-silicon layer, a metal layer, and a hard mask layer, which are sequentially stacked on the substrate 10. Furthermore, spacers may be formed to cover both sidewalls of the peripheral gate stacks PGS, and source/drain regions may be formed in the active region ACT and at both sides of the peripheral gate stacks PGS.

After the formation of the peripheral structure, an insulating buffer layer 11 and a lower sacrificial layer LSL may be sequentially formed to cover the substrate 10 provided with the peripheral gate stacks PGS.

The lower sacrificial layer LSL may be formed to conformally cover a top surface of the substrate 10 and the peripheral gate stacks PGS. As an example, the peripheral gate stack PGS may have a first thickness T1, and the lower sacrificial layer LSL may have a second thickness T2 that is smaller than the first thickness T1. In embodiments where the peripheral gate stacks PGS are provided to be adjacent to each other, the lower sacrificial layer LSL on the peripheral circuit region PCR may be formed to fill gap regions between the peripheral gate stacks PGS.

The lower sacrificial layer LSL may be formed of or include a material having an etch selectivity with respect to the insulating buffer layer 11. For example, the lower sacrificial layer LSL may be formed of at least one of silicon nitride, silicon oxynitride, silicon carbide, and silicon germanium.

The insulating buffer layer 11 may be between the lower sacrificial layer LSL and the substrate 10 and between the lower sacrificial layer LSL and the peripheral gate stacks PGS. In some embodiments, the insulating buffer layer 11 may be a silicon oxide layer, which may be formed by a thermal oxidation process or a deposition process.

Figure 5:
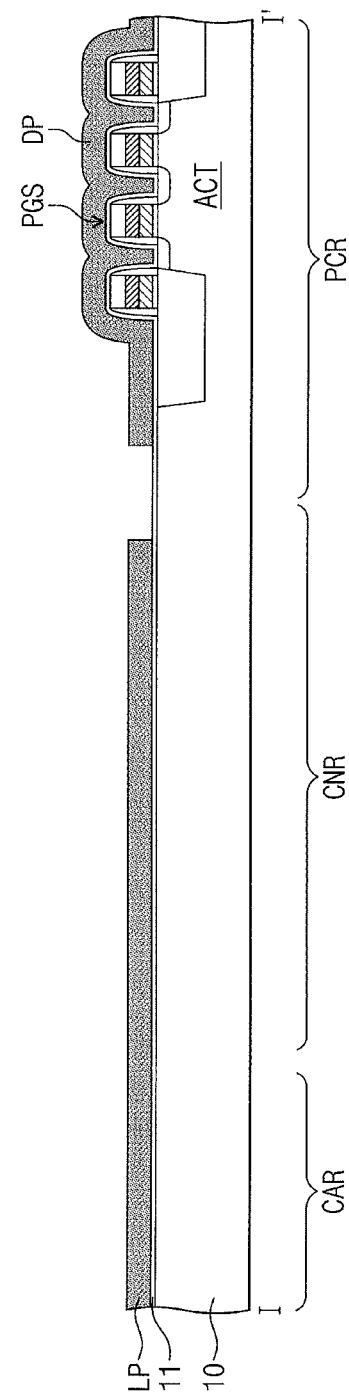

Referring to FIGS. 3 and 5, the lower sacrificial layer LSL may be patterned to form a lower sacrificial pattern LP and a dummy sacrificial pattern DP that are spaced apart from each other.

The formation of the lower and dummy sacrificial patterns LP and DP may include forming a mask pattern (not shown) on the lower sacrificial layer LSL and anisotropically etching the lower sacrificial layer LSL using the mask pattern as an etch mask. In these embodiments, the mask pattern may be formed to have an opening on the peripheral circuit region PCR, and the opening of the mask pattern may be formed to be spaced apart from the peripheral gate stacks PGS.

The dummy sacrificial pattern DP may be formed on the peripheral circuit region PCR to cover the substrate 10 and the peripheral gate stacks PGS, and the lower sacrificial pattern LP may be formed on the cell array region CAR and the connection region CNR to cover the substrate 10.

In some embodiments, the lower sacrificial pattern LP may have a plate-shaped structure covering the substrate 10 on the cell array region CAR and the connection region CNR or a line-shaped structure extending from the cell array region CAR to the connection region CNR or may have an opening on the connection region CNR.

Figure 6:
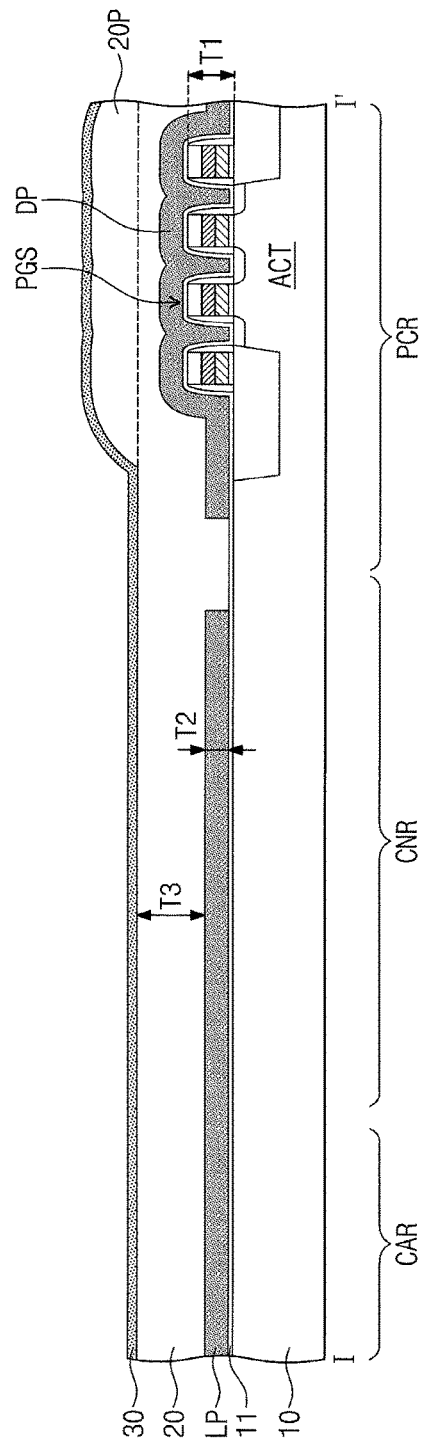

Referring to FIGS. 3 and 6, a lower insulating layer 20 may be formed to cover the top surface of the substrate 10. The lower insulating layer 20 may be deposited on the lower sacrificial pattern LP and the dummy sacrificial pattern DP and may have a uniform thickness. The lower insulating layer 20 may be a silicon oxide layer, for example, a high density plasma (HDP) oxide layer.

In some embodiments, the lower insulating layer 20 may have a third thickness T3 that is greater than a sum of the first thickness T1 of the peripheral gate stack PGS and the second thickness T2 of the lower sacrificial layer LSL. The third thickness T3 of the lower insulating layer 20 may be greater than a distance between the top surface of the substrate 10 and the uppermost top surface of the dummy sacrificial pattern DP. In some embodiments, a top surface of the lower insulating layer 20 on the cell array region CAR may be positioned above the uppermost top surface of the dummy sacrificial pattern DP on the peripheral circuit region PCR. In certain embodiments, the top surface of the lower insulating layer 20 on the cell array region CAR may be positioned below the uppermost top surface of the dummy sacrificial pattern DP on the peripheral circuit region PCR.

The top surface of the lower insulating layer 20 may have a height difference that corresponds to a difference between the first thickness T1 of the peripheral gate stack PGS and the second thickness T2 of the lower sacrificial layer LSL. The lower insulating layer 20 may have a substantially flat top surface on the cell array region CAR and the connection region CNR but may have a protruding portion 20P on the peripheral circuit region PCR. Accordingly, the top surface of the lower insulating layer 20 may be higher on the peripheral circuit region PCR than on the cell array region CAR.

Thereafter, an etch stop layer 30 may be formed on the lower insulating layer 20. The etch stop layer 30 may be formed of a material, for example, silicon nitride or silicon oxynitride, having an etch selectivity with respect to the lower insulating layer 20.

Figure 7:
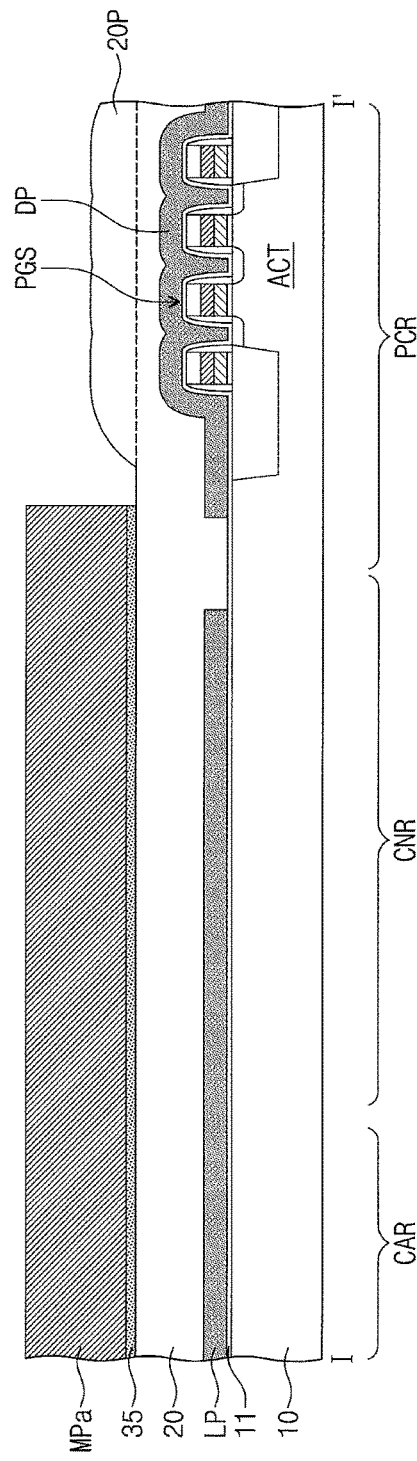

Referring to FIGS. 3 and 7, the etch stop layer 30 may be patterned to form an etch stop pattern 35. The formation of the etch stop pattern 35 may include forming a mask pattern MPa on the etch stop layer 30 to expose the peripheral circuit region PCR and anisotropically etching the etch stop layer 30 using the mask pattern MPa as an etch mask. The etch stop pattern 35 may be formed the protruding portion 20P of the lower insulating layer 20 on the peripheral circuit region PCR.

Figure 8:
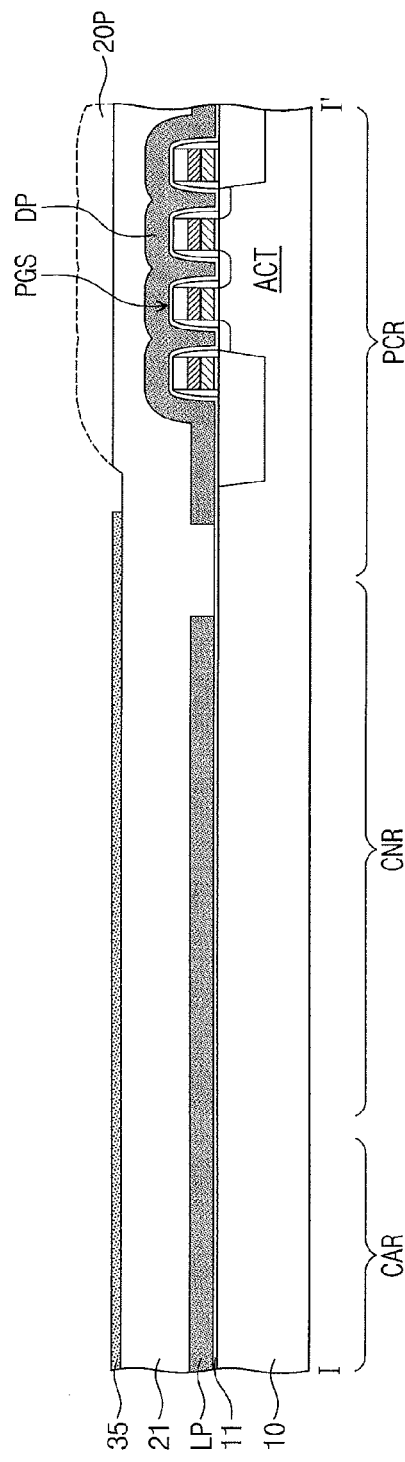

Referring to FIGS. 3 and 8, a planarization process may be performed on the lower insulating layer 20 to remove the protruding portion 20P of the lower insulating layer 20. As a result of the removal of the protruding portion 20P, it may be possible to reduce a difference in height of the top surface of the lower insulating layer 20 between the cell array region CAR and the peripheral circuit region PCR.

The planarization process may be performed using a chemical mechanical polishing (CMP) process. A slurry, for example, silica- and/or ceria-based slurry, having an etch selectivity with respect to the etch stop pattern 35 may be used for the CMP process on the lower insulating layer 20. During the planarization process, the etch stop layer 30 or the etch stop pattern 35 may be used to detect a termination point of the planarization process. Thus, during the CMP process, it may be possible to reduce the likelihood, or possibly prevent, the lower insulating layer 20 from being exposed on the cell array region CAR and the connection region CNR. In other words, the use of the etch stop layer 30 may make it possible to reduce the likelihood that, or possibly prevent, a thickness of the lower insulating layer 20 on the cell array region CAR and the connection region CNR from being changed, during the planarization process on the lower insulating layer 20.

After the planarization process, the etch stop pattern 35 may be removed using an etch recipe having an etch selectivity with respect to the lower insulating layer 20. Accordingly, a thickness of the lower insulating layer 20, which is exposed on the cell array region CAR and the connection region CNR, may be substantially uniform.

In some embodiments, after the planarization process, the lower insulating layer 20 may have a substantially flat top surface and may have a thickness that is smaller on the peripheral circuit region PCR than on the cell array region CAR. In certain embodiments, after the planarization process, the lower insulating layer 20 may expose the top surface of the dummy sacrificial pattern DP on the peripheral circuit region PCR.

Figure 9:
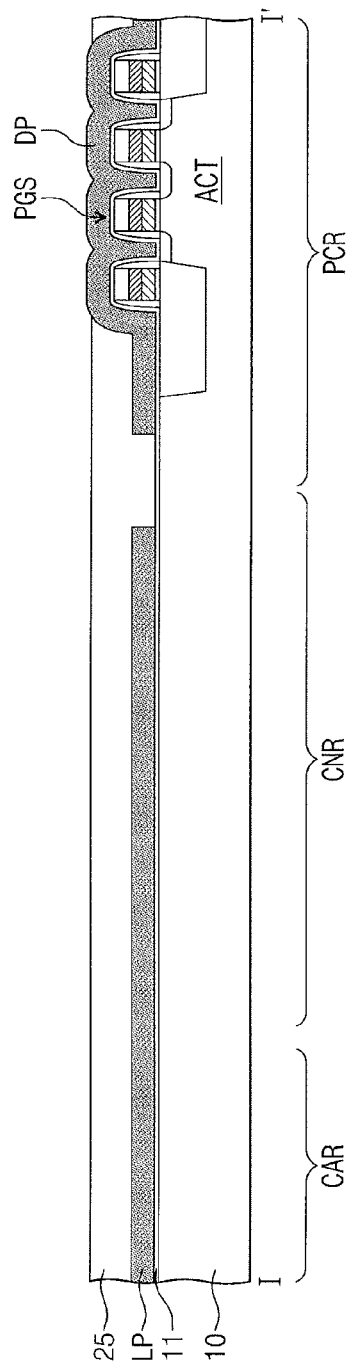

Referring to FIGS. 3 and 9, a top surface of a planarized lower insulating layer 21 may be recessed to form a lower insulating planarized layer 25 exposing the uppermost top surface of the dummy sacrificial pattern DP on the peripheral circuit region PCR. In other words, the dummy sacrificial pattern DP on the peripheral gate stacks PGS may be formed to have an exposed top surface, and the planarized lower insulating layer 21 may have a reduced thickness on the cell array region CAR. In some embodiments, the top surface of the lower insulating planarized layer 25 may be positioned at a level that is substantially equal to or lower than that of the peripheral gate stack PGS. Alternatively, a top surface of the lower insulating planarized layer 25 may be substantially coplanar with or lower than the uppermost surface of the dummy sacrificial pattern DP. In certain embodiments, the recessing of the planarized lower insulating layer 21 may be omitted.

As an example, the recessing of the planarized lower insulating layer 21 may include isotropically etching the planarized lower insulating layer 21, for example, using a wet etching process. For example, the isotropic etching process on the planarized lower insulating layer 21 may be performed using an etchant in which an additive agent such as Ammonium Ploycarboxylate (APC) is contained.

Figure 10:
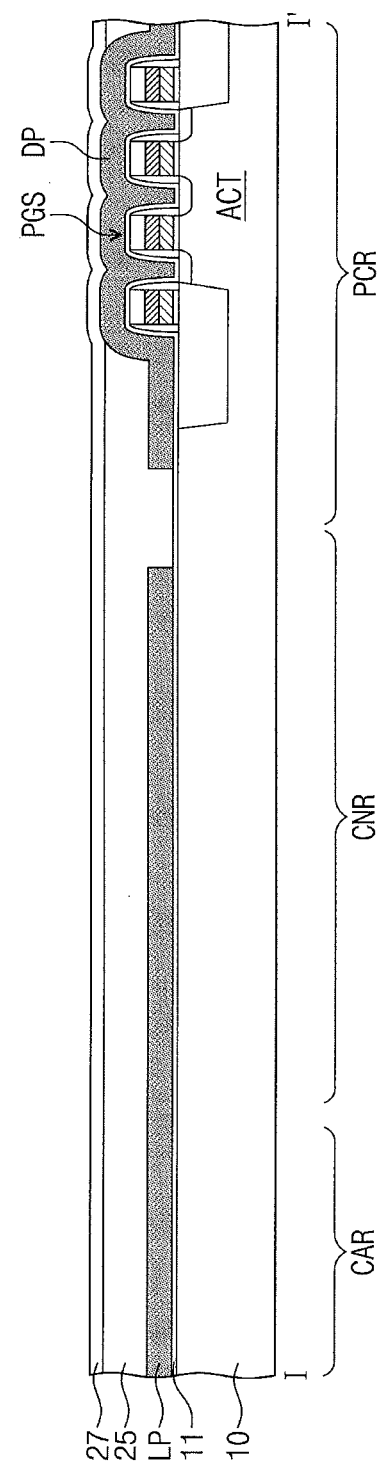

Referring to FIGS. 3 and 10, a dummy insulating layer 27 may be formed on the lower insulating planarized layer 25. The dummy insulating layer 27 may be formed to cover a top surface of the dummy sacrificial pattern DP. In some embodiments, the dummy insulating layer 27 may be formed of the same material as the lower insulating planarized layer 25. For example, the dummy insulating layer 27 may be formed of a silicon oxide layer, for example, an HDP oxide layer.

In some embodiments, the lower insulating planarized layer 25 or the dummy insulating layer 27 may be formed to reduce a height difference between the cell array region CAR and the peripheral circuit region PCR. In other words, the dummy insulating layer 27 may be formed to have a substantially flat top surface.

Referring back to FIG. 2, the lower insulating planarized layer 25 and the dummy insulating layer 27 may have thicknesses that are determined according to a distance between the ground selection line GSL and the word line WL0 adjacent thereto. In other words, the thicknesses of the lower insulating planarized layer 25 and the dummy insulating layer 27 may be changed to control the distance between the ground selection line GSL and the word line WL0. In embodiments where the lower insulating planarized layer 25 is formed to have an optimized thickness on the cell array region CAR and the connection region CNR, the formation of the dummy insulating layer 27 may be omitted.

Figure 11:
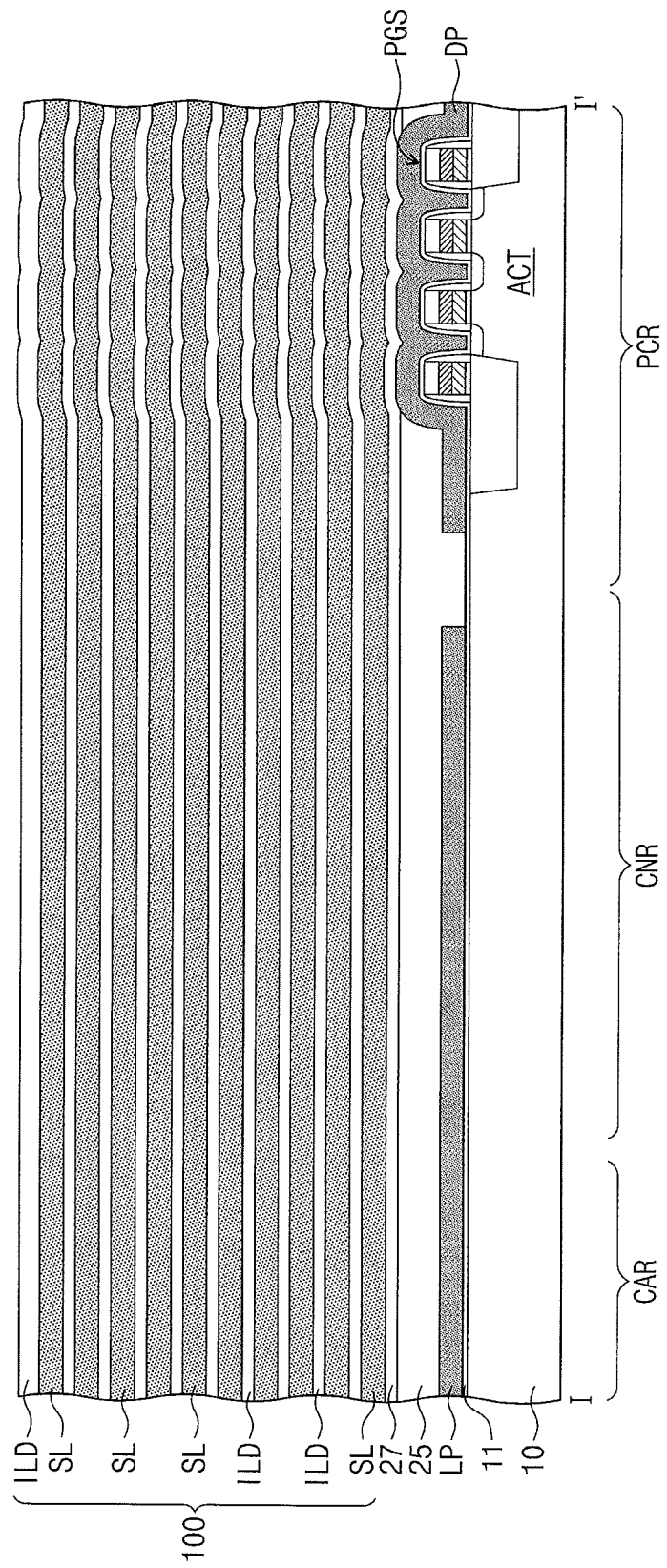

Referring to FIGS. 3 and 11, a layered structure 100 may be formed on the dummy insulating layer 27. The layered structure 100 may include upper sacrificial layers SL and upper insulating layers ILD that are alternatingly stacked on the dummy insulating layer 27.

The layered structure 100 may be formed on not only the cell array region CAR but also the peripheral circuit region PCR. In some embodiments, the layered structure 100 may be formed to have a height difference between potions located on the cell array region CAR and the peripheral circuit region PCR, but the height difference in the layered structure 100 may be less than that between the top surfaces of the lower sacrificial pattern LP and the dummy sacrificial pattern DP. In other words, since the dummy insulating layer 27 has a substantially flat top surface, it may be possible to reduce the likelihood, or possibly prevent, the layered structure 100 from having a large height difference between the peripheral circuit region PCR and the cell array region CAR.

The upper sacrificial layers SL of the layered structure 100 may be formed of a material which can be etched with a high etch selectivity with respect to the upper insulating layers ILD. For example, the upper sacrificial layers SL and the upper insulating layers ILD may be formed of insulating materials having an etch selectivity with respect to each other. In other words, the upper sacrificial layers SL may be formed of an insulating material different from the upper insulating layers ILD. In certain embodiments, the upper sacrificial layers SL may be formed of the same material as the lower sacrificial pattern LP. For example, the upper sacrificial layers SL may be formed of silicon nitride, and the upper insulating layers ILD may be formed of silicon oxide.

Figure 19:
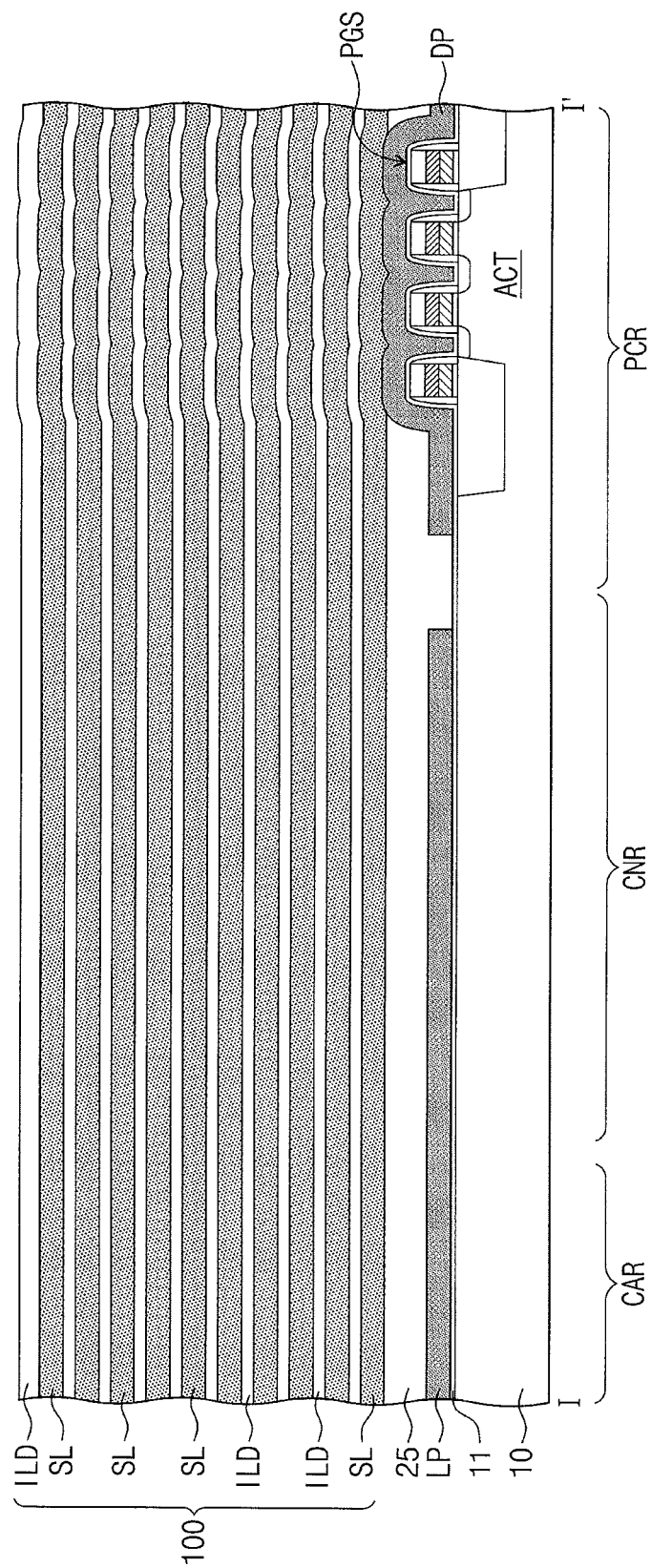

In some embodiments, the layered structure 100 may be formed in such a way that the lowermost one of the upper sacrificial layers SL is in contact with the dummy insulating layer 27. In certain embodiments, the lower insulating planarized layer 25 may be extended to cover not only the lower sacrificial pattern LP but also the dummy sacrificial pattern DP, and in embodiments where the dummy insulating layer 27 is omitted, the lowermost one of the upper sacrificial layers SL may be in contact with the lower insulating planarized layer 25 throughout the entire region of the substrate 10. In certain embodiments, as shown in FIG. 19, the lowermost one of the upper sacrificial layers SL may be in contact with the lower insulating planarized layer 25 on the cell array region CAR and the connection region CNR and may be in contact with the dummy sacrificial pattern DP on the peripheral circuit region CNR.

Figure 12:
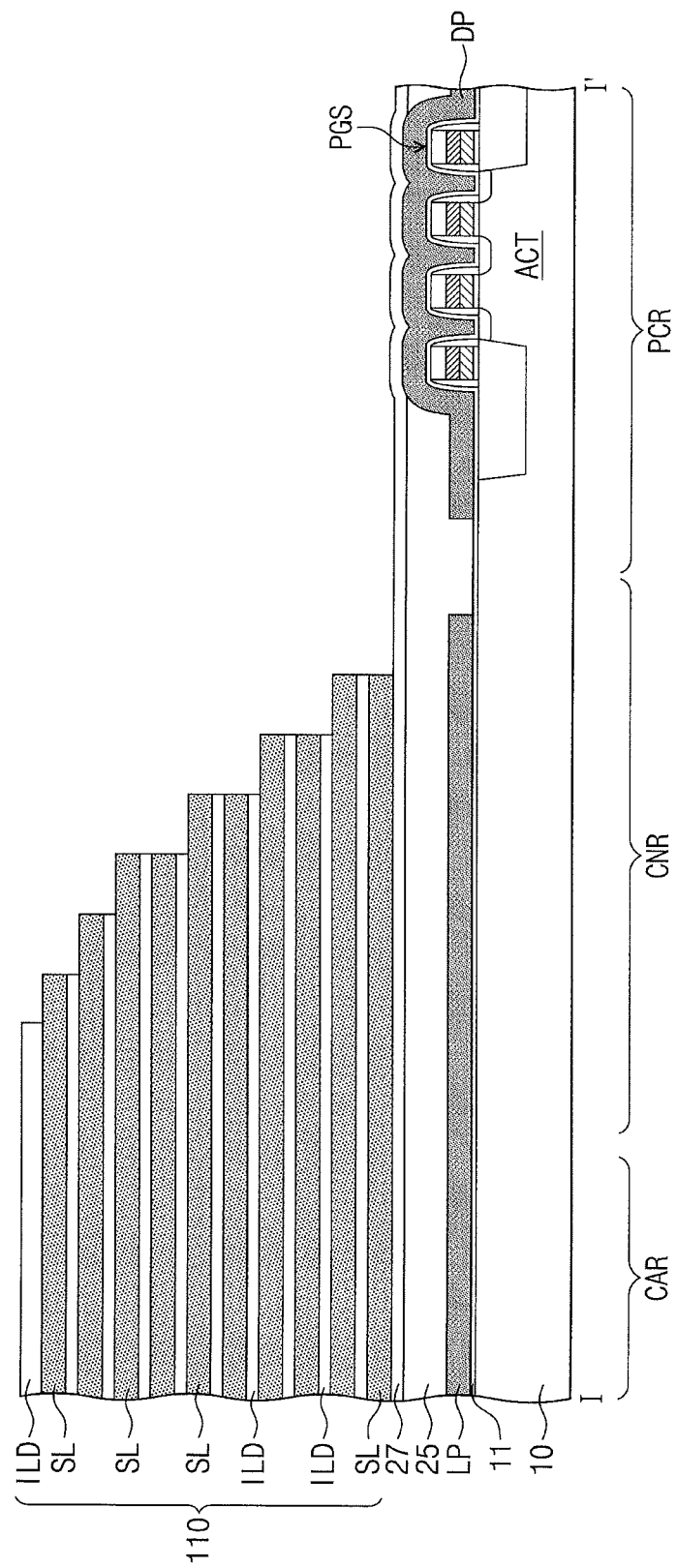

Referring to FIGS. 3 and 12, a mold structure 110 may be formed by performing a trimming process on the layered structure 100. The mold structure 110 may extend from the cell array region CAR to the connection region CNR and may have a staircase structure on the connection region CNR. For example, the mold structure 110 may have a staircase structure, whose height decreases in a stepwise manner in a direction toward the peripheral circuit region PCR. In other words, a height of the mold structure 110 may decrease in a direction from the connection region CNR toward the peripheral circuit region PCR.

In particular, the trimming process may include steps of forming a mask pattern (not shown) to cover the layered structure 100 on the cell array region CAR and the connection region CNR, etching a portion of the layered structure 100, and reducing a horizontal area of the mask pattern. In some embodiments, the steps of etching a portion of the layered structure 100 and reducing a horizontal area of the mask pattern may be repeated at least one time during the trimming process.

In some embodiments, the mold structure 110 may be formed to expose the dummy insulating layer 27 on the peripheral circuit region PCR. In certain embodiments, in embodiments where the dummy insulating layer 27 is omitted, the top surface of the dummy sacrificial pattern DP on the peripheral circuit region PCR may be exposed, as shown in FIG. 20.

Figure 13:
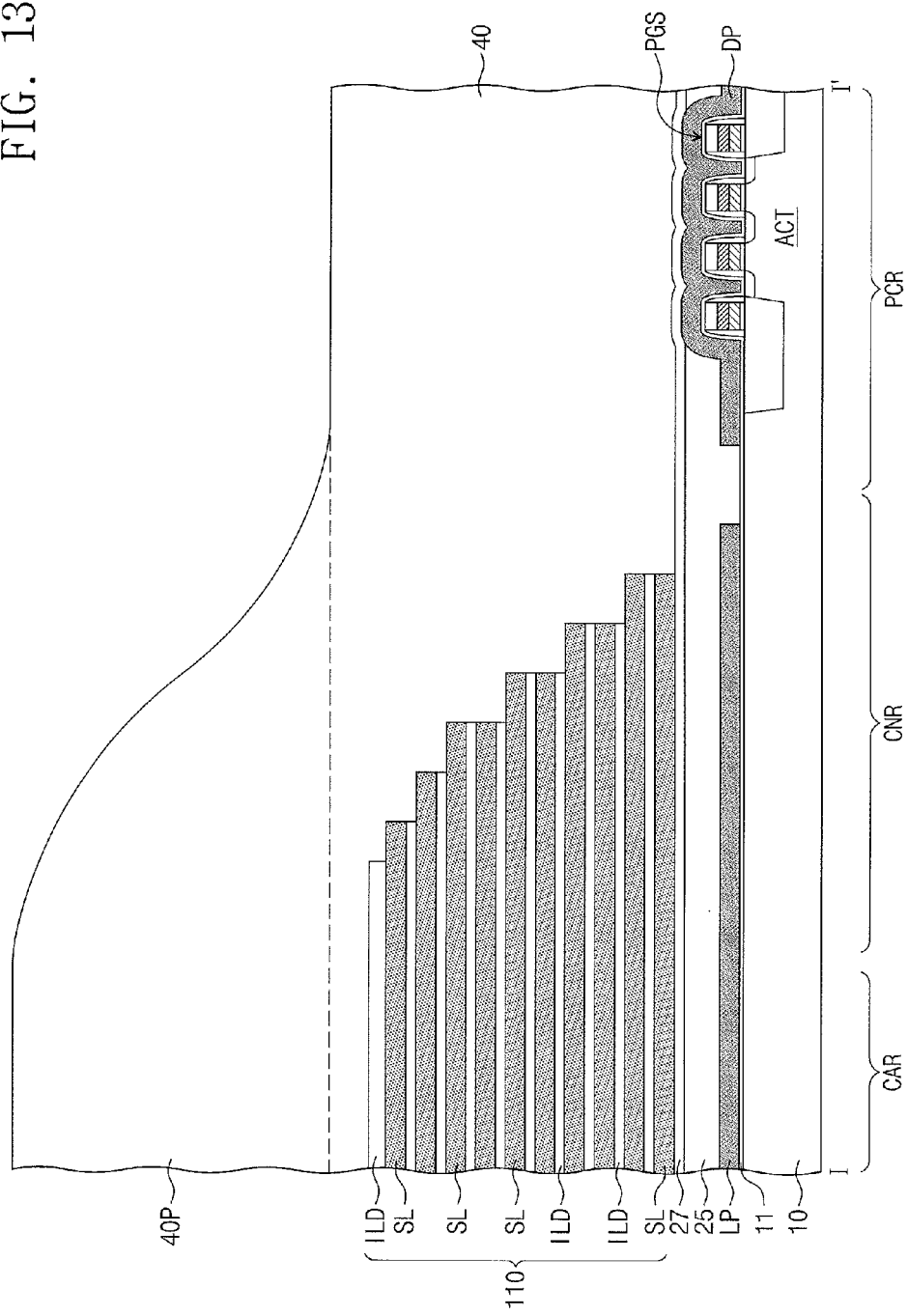

Referring to FIGS. 3 and 13, an insulating gapfill layer 40 may be deposited on the substrate 10. The insulating gapfill layer 40 may be formed to have a thickness greater than that of the mold structure 110. In some embodiments, the insulating gapfill layer 40 may be formed to have a substantially flat top surface on the peripheral circuit region PCR and have a slanted top surface on the connection region CNR.

Due to the presence of the mold structure 110, the top surface of the insulating gapfill layer 40 may have a height difference between the cell array region CAR and the peripheral circuit region PCR. The thickness of the insulating gapfill layer 40 may be greater than a thickness or height of the mold structure 110. A level of the top surface of the insulating gapfill layer 40 may be lower on the peripheral circuit region PCR than on the cell array region CAR, and thus, the insulating gapfill layer 40 may include a protruding portion 40P on the cell array region CAR. Furthermore, the top surface of the insulating gapfill layer 40 on the peripheral circuit region PCR may be positioned at a level higher than that of the uppermost top surface of the mold structure 110.

The insulating gapfill layer 40 may be formed of or include an insulating material having an etch selectivity with respect to the lower sacrificial pattern LP and the upper sacrificial layers SL. For example, the insulating gapfill layer 40 may be formed of at least one of high density plasma (HDP) oxide, tetraethylorthosilicate (TEOS), plasma-enhanced TEOS (PE-TEOS), $O_3$-TEOS, undoped silicate glass (USG), phosphosilicate glass (PSG), borosilicate glass (BSG), borophosphosilicate glass (BPSG), fluoride silicate glass (FSG), spin on glass (SOG), and tonen silazene (TOSZ).

Figure 14:
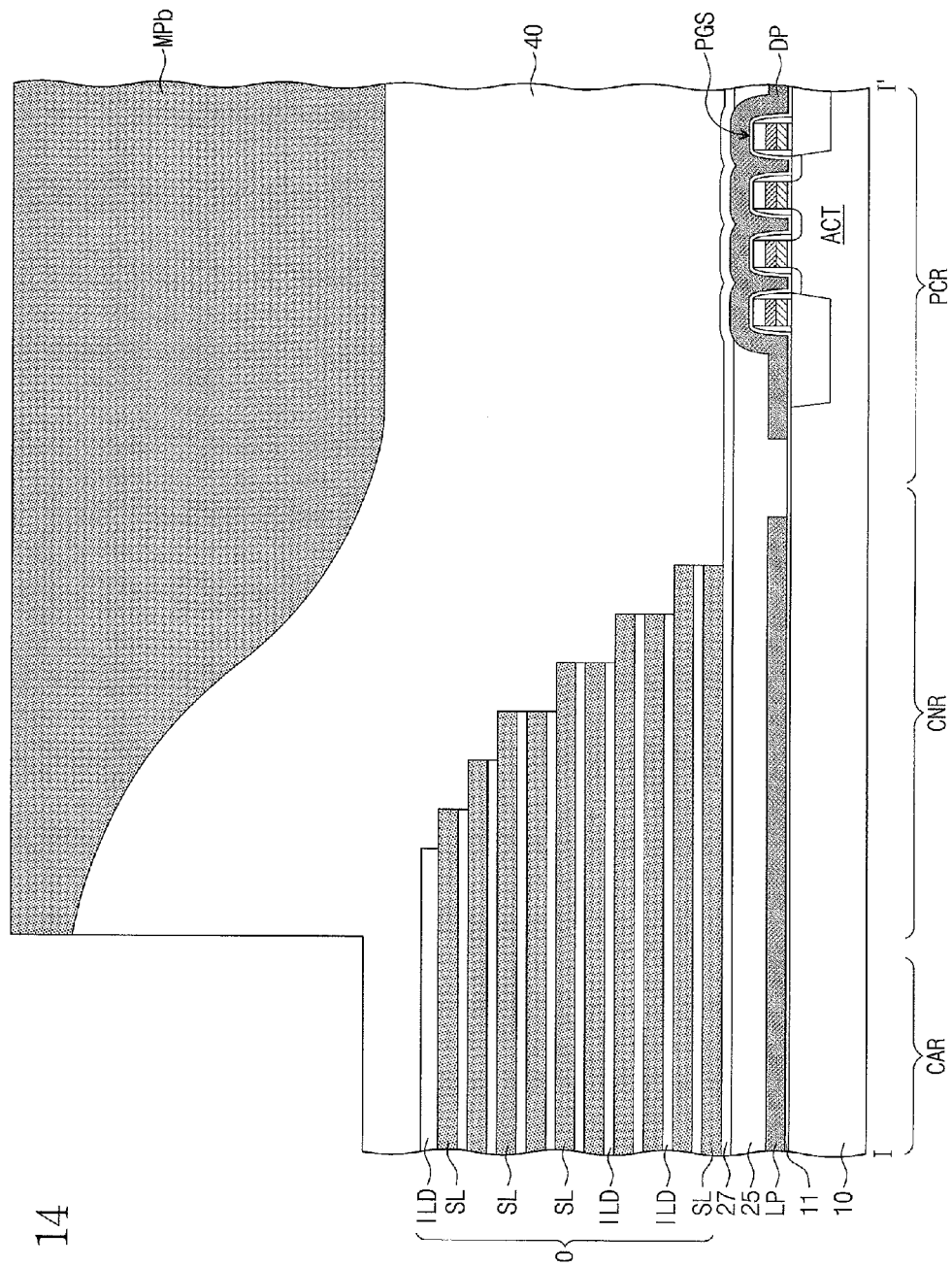

Referring to FIGS. 3 and 14, a patterning process may be performed to remove the protruding portion 40P of the insulating gapfill layer 40. The patterning of the insulating gapfill layer 40 may include forming a mask pattern MPb exposing the cell array region CAR on the insulating gapfill layer 40 and etching the protruding portion 40P of the insulating gapfill layer 40 using the mask pattern MPb as an etch mask. Accordingly, a thickness of the insulating gapfill layer 40 on the cell array region CAR may be reduced.

The mask pattern MPb may be removed, and a planarization process may be performed on the insulating gapfill layer 40. Accordingly, an upper insulating planarized layer 45 having a substantially flat top surface may be formed, as shown in FIG. 15.

Figure 15:
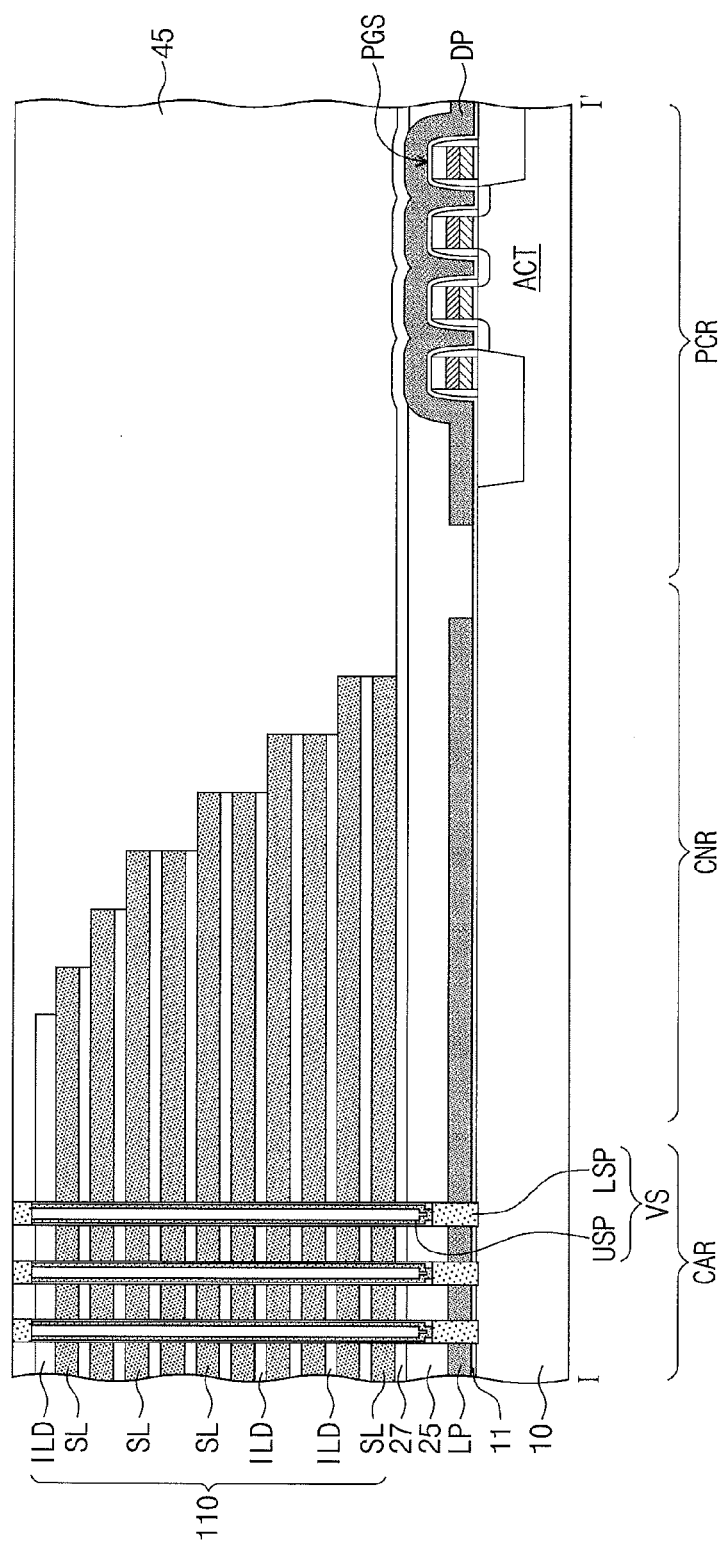

Referring to FIGS. 3 and 15, vertical structures VS may be formed on the cell array region CAR to penetrate the mold structure 110, the dummy insulating layer 27, the lower insulating layer 20, the lower sacrificial pattern LP, and the insulating buffer layer 11, after the formation of the upper insulating planarized layer 45.

When viewed in a plan view, the vertical structures VS may be arranged in a specific direction or in a zigzag shape. Furthermore, dummy vertical structures DVS may be formed on the connection region CNR, and the dummy vertical structures DVS may have substantially the same vertical structures VS. In some embodiments, the dummy vertical structures DVS may be formed to penetrate the upper sacrificial layers SL and the lower sacrificial pattern LP.

The formation of the vertical structures VS may include forming vertical holes to penetrate the mold structure 110, the dummy insulating layer 27, the lower insulating layer 20, the lower sacrificial pattern LP, and the insulating buffer layer 11 and thereby to expose the substrate 10, and then, forming a lower semiconductor pattern LSP and an upper semiconductor pattern USP in each of the vertical holes.

The lower semiconductor pattern LSP may be formed by a selective epitaxial growth (SEG) process, in which the substrate 10 exposed by the vertical holes is used as a seed layer. Accordingly, the lower semiconductor pattern LSP may have a pillar-shaped structure filling a lower region of the vertical hole. A top surface of the lower semiconductor pattern LSP may be positioned at a higher level than that of the lower sacrificial pattern LP. In some embodiments, the top surface of the lower semiconductor pattern LSP may be positioned between the top surface of the lower sacrificial pattern LP and the top surface of the lower insulating planarized layer 25.

The lower semiconductor pattern LSP may be formed to have a single- or poly-crystalline structure, but the inventive concept may not be limited thereto. The lower semiconductor pattern LSP may be formed of, for example, carbon nano structures, organic semiconductor materials, and/or compound semiconductor materials. The lower semiconductor pattern LSP may be formed to have the same conductivity type as the substrate 10. The lower semiconductor pattern LSP may be doped in situ during the selective epitaxial growth process. In some embodiments, the lower semiconductor pattern LSP may be doped by an additional ion implantation process, after the formation of the lower semiconductor pattern LSP.

The upper semiconductor pattern USP may be formed in the vertical hole provided with the lower semiconductor pattern LSP. The upper semiconductor pattern USP may be in contact with the lower semiconductor pattern LSP. In particular, as shown in FIG. 22, the upper semiconductor pattern USP may include a first semiconductor pattern SP1 and a second semiconductor pattern SP2. The first semiconductor pattern SP1 may be coupled to the lower semiconductor pattern LSP and may have a pipe or macaroni shape with closed bottom and open top. An inner space of the first semiconductor pattern SP1 may be filled with an insulating gapfill pattern VI. Furthermore, the first semiconductor pattern SP1 may be in contact with an inner surface of the second semiconductor pattern SP2 and the top surface of the lower semiconductor pattern LSP. In other words, the first semiconductor pattern SP1 may allow the second semiconductor pattern SP2 to be electrically connected to the lower semiconductor pattern LSP. The second semiconductor pattern SP2 may be shaped like a hollow pipe or macaroni whose top and bottom are open. The second semiconductor pattern SP2 may be spaced apart from, i.e., not in contact with, the lower semiconductor pattern LSP.

The upper semiconductor pattern USP may be in an undoped state or may be doped to have the same conductivity type as the substrate 10. The upper semiconductor pattern USP may be formed of or include at least one of doped or intrinsic semiconductor materials, for example, silicon (Si), germanium (Ge), or compounds thereof. Furthermore, the upper semiconductor pattern USP may include one of single-crystalline, amorphous, and poly-crystalline structures. A conductive pad may be formed on a top surface of each of the upper semiconductor patterns USP. The conductive pad may be a doped impurity region or may be fainted of a conductive material.

In some embodiments, before the formation of the upper semiconductor pattern USP, a vertical insulating pattern VP may be formed in the vertical hole, as shown in FIG. 22. The vertical insulating pattern VP may include one or more layers. In some embodiments, the vertical insulating pattern VP may serve as a part of the data storing layer. For example, the vertical insulating pattern VP may include a charge storing layer, which may serve as a memory element of a NAND FLASH memory device. The charge storing layer may be a trap insulating layer or an insulating layer with conductive nanodots. In certain embodiments, the vertical insulating layer may include at least one layer (not shown) exhibiting a phase-changeable or variable resistance property.

Figure 16:
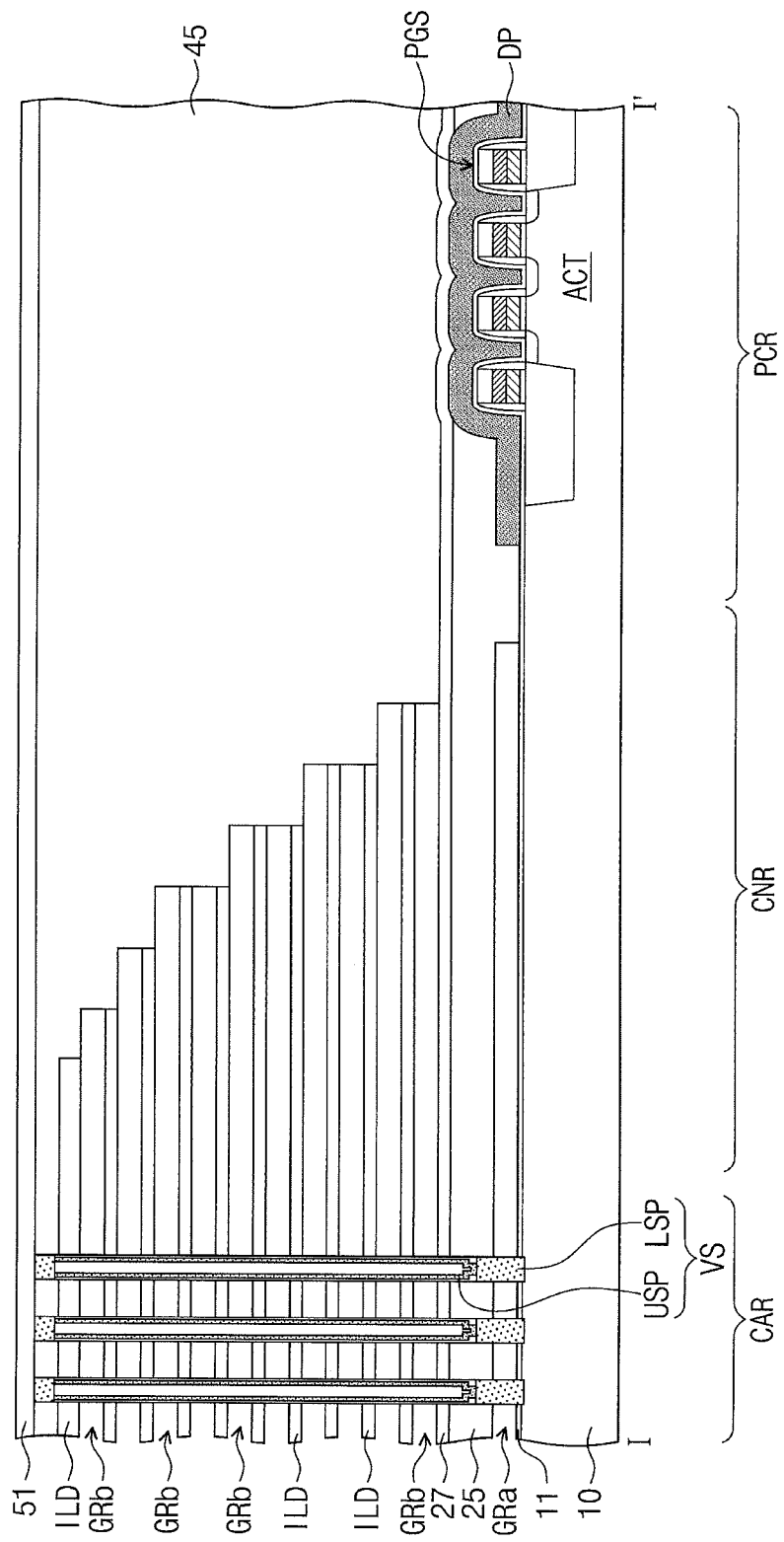

Referring to FIGS. 3, 16, and 21, a first interlayered insulating layer 51 may be formed on the upper insulating planarized layer 45 to cover top surfaces of the vertical structures VS. The first interlayered insulating layer 51, the upper insulating planarized layer 45, the mold structure 110, the lower insulating planarized layer 25, and the lower sacrificial pattern LP may be patterned to form line-shaped trenches. The trenches may be formed to extend in a first direction D1 but may be spaced apart from each other in a second direction D2 crossing the first direction D1. In some embodiments, the trenches may have at least two different lengths. As a result of the formation of the trenches, when viewed in a plan view, the mold structure 110 may have an 'H' shape. The trenches may be spaced apart from the vertical structures VS and may be formed to expose sidewalls of the upper sacrificial layers SL and the lower sacrificial pattern LP.

After the formation of the trenches, common source regions CSR may be formed in portions of the substrate 10 exposed by the trenches. The common source regions CSR may extend parallel to the first direction D1 and may be spaced apart from each other in the second direction D2. The common source regions CSR may be doped to have a different conductivity type from that of the substrate 10. For example, the common source regions CSR may be doped with n-type impurities, for example, arsenic (As) or phosphorus (P).

After the formation of the trenches, a replacement process may be performed to replace the lower sacrificial pattern LP and the upper sacrificial layers SL, which are exposed by the trenches, with a lower electrode ELa and upper electrodes ELb, respectively. In these embodiments, the lower electrode ELa and the upper electrodes ELb may be formed at substantially the same time by the same process.

For example, as shown in FIG. 16, the upper sacrificial layers SL exposed by the trenches may be removed to form upper gate regions GRb, and the lower sacrificial pattern LP may be removed to form a lower gate region GRa. The lower and upper gate regions GRa and GRb, respectively, may be formed by isotropically etching the upper sacrificial layers SL and the lower sacrificial pattern LP, and the isotropic etching process may be performed using an etch recipe that is selected to have an etch selectivity with respect to the insulating buffer layer 11, the lower insulating planarized layer 25, the upper insulating layers ILD, the vertical structures VS, and the substrate 10. In some embodiments, the isotropic etching process may be performed to completely remove the upper sacrificial layers SL and the lower sacrificial pattern LP. In embodiments where the upper sacrificial layers SL and the lower sacrificial pattern LP are formed of silicon nitride and the insulating buffer layer 11, the lower insulating planarized layer 25, the upper insulating layers ILD are formed of silicon oxide, the isotropic etching process may be performed using an etching solution containing phosphoric acid.

The upper gate regions GRb may be gap regions that are formed between vertically-adjacent ones of the upper insulating layers ILD and between the trench and the vertical structure VS. For example, each of the upper gate regions GRb may be formed to partially expose a sidewall of the vertical structure VS. The lower gate region GRa may be a gap region that is formed between the insulating buffer layer 11 and the lower insulating planarized layer 25 to partially expose a sidewall of the lower semiconductor pattern LSP.

Figure 17:
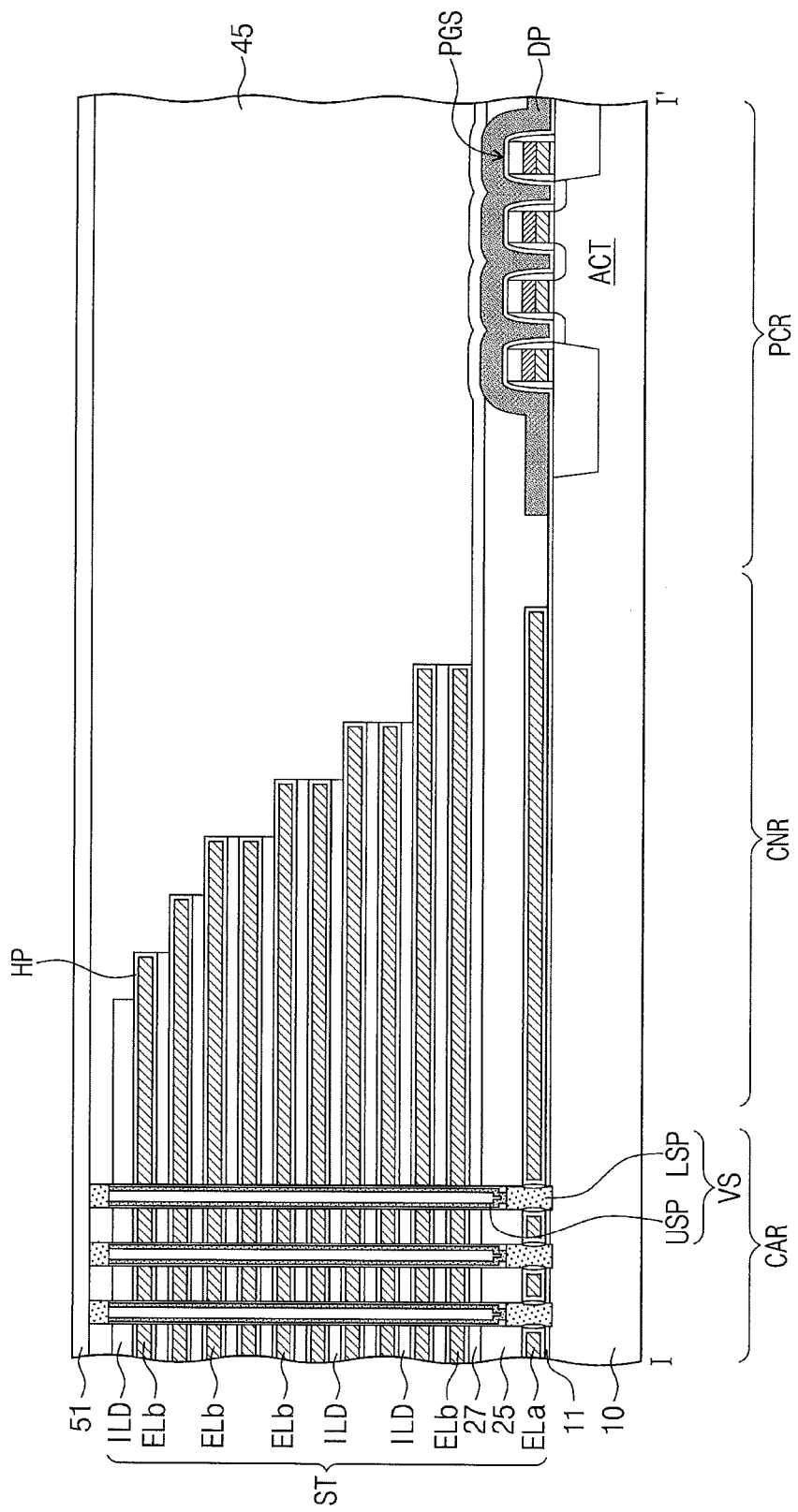

Referring to FIGS. 3, 17, and 21, the lower electrode ELa may be formed in the lower gate region GRa and the upper electrodes ELb may be formed in the upper gate regions GRb. The lower and upper electrodes ELa and ELb may be formed to partially or wholly fill the lower and upper gate regions GRa and GRb, respectively. The formation of the lower and upper electrodes ELa and ELb may include sequentially depositing a barrier metal layer and a metal layer. The barrier metal layer may be formed of or include at least one of metal nitride materials, for example, TiN, TaN, and WN. The metal layer may be formed of or include at least one of metallic materials, for example, W, Al, Ti, Ta, Co, and Cu.

Before the formation of the lower electrode ELa and the upper electrodes ELb, a horizontal insulating pattern HP may be formed to conformally cover inner surfaces of the lower and upper gate regions GRa and GRb, as shown in FIG. 22. In a NAND FLASH memory transistor, the horizontal insulating pattern HP may serve as a part of a data storing layer of a memory transistor. Furthermore, before the formation of the horizontal insulating pattern HP, a thermal oxidation layer 13 may be formed on a sidewall of the lower semiconductor pattern LSP exposed by the lower gate region GRa. The lower and upper electrodes ELa and ELb, respectively, may constitute an electrode structure ST that has a staircase structure on the connection region CNR.

After the formation of the electrode structure ST, common source plugs CSP may be formed to be connected to the common source regions CSR, as shown in FIG. 21. Furthermore, an insulating spacer SP may be formed between the common source plugs CSP and the electrode structure ST or on sidewalls of trenches.

Figure 18:
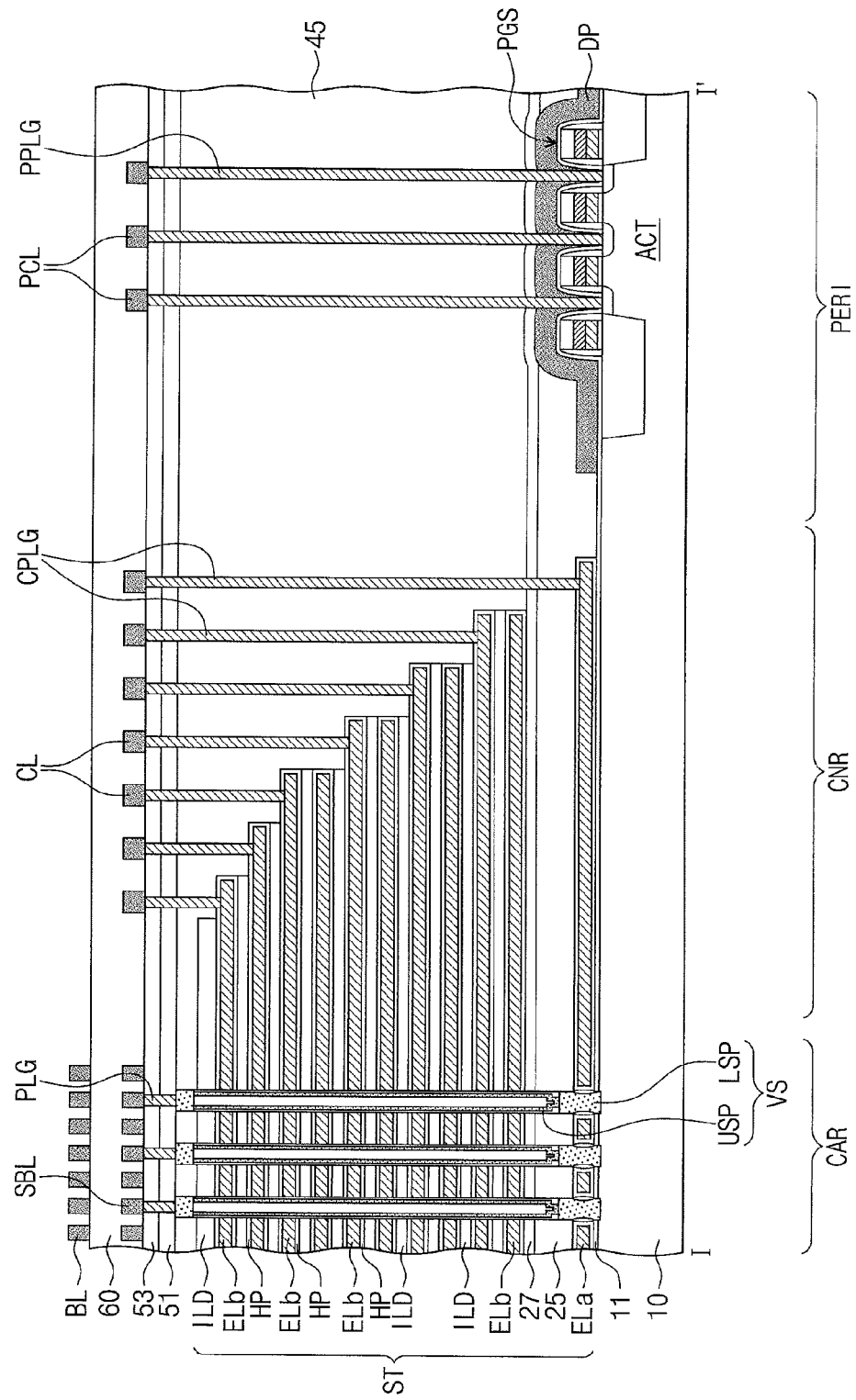

Referring to FIGS. 3, 18, and 21, a second interlayered insulating layer 53 may be formed on the first interlayered insulating layer 51 to cover top surfaces of the common source plugs CSP. Thereafter, contact plugs PLG, cell contact plugs CPLG, and peripheral contact plugs PPLG may be formed on the cell array region CAR, the connection region CNR, and the peripheral circuit region PCR, respectively.

The contact plugs PLG may be formed to penetrate the first and second interlayered insulating layers 51 and 53 and may be coupled to the vertical structures VS, respectively. The cell contact plugs CPLG may be formed to penetrate the first and second interlayered insulating layers 51 and 53 and the upper insulating planarized layer 45 and may be coupled to end portions of the upper electrodes ELb, respectively. One of the cell contact plugs CPLG may be formed to penetrate the first and second interlayered insulating layers 51 and 53, the upper insulating planarized layer 45, and the lower insulating planarized layer 25 and may be coupled to an end portion of the lower electrode ELa. Vertical lengths of the cell contact plugs CPLG may decrease with decreasing distance from the cell array region CAR. Top surfaces of the cell contact plugs CPLG may be substantially coplanar with each other.

The peripheral contact plugs PPLG may be formed to penetrate the first and second interlayered insulating layers 51 and 53, the upper insulating planarized layer 45, and the dummy sacrificial pattern DP and may be coupled to the peripheral structure. In other words, the peripheral contact plugs PPLG may be coupled to source/drain regions and the peripheral gate stacks PGS.

Thereafter, sub-bit lines SBL, interconnection lines CL, and peripheral lines PCL may be formed on the cell array region CAR, the connection region CNR, and the peripheral circuit region PCR, respectively. Each of the sub-bit lines SBL may be coupled to an adjacent pair of the contact plugs PLG. The interconnection lines CL may be coupled to the cell contact plugs CPLG, and the peripheral lines PCL may be coupled to the peripheral contact plugs PPLG.

A third interlayered insulating layer 60 may be formed on the second interlayered insulating layer 53, and the bit lines BL may be formed on the third interlayered insulating layer 60. The bit lines BL may be formed to cross the electrode structure ST or extend in the second direction D2, and each of the bit lines BL may be coupled to the sub-bit lines SBL through bit line contact plugs BPLG.

Figure 23:
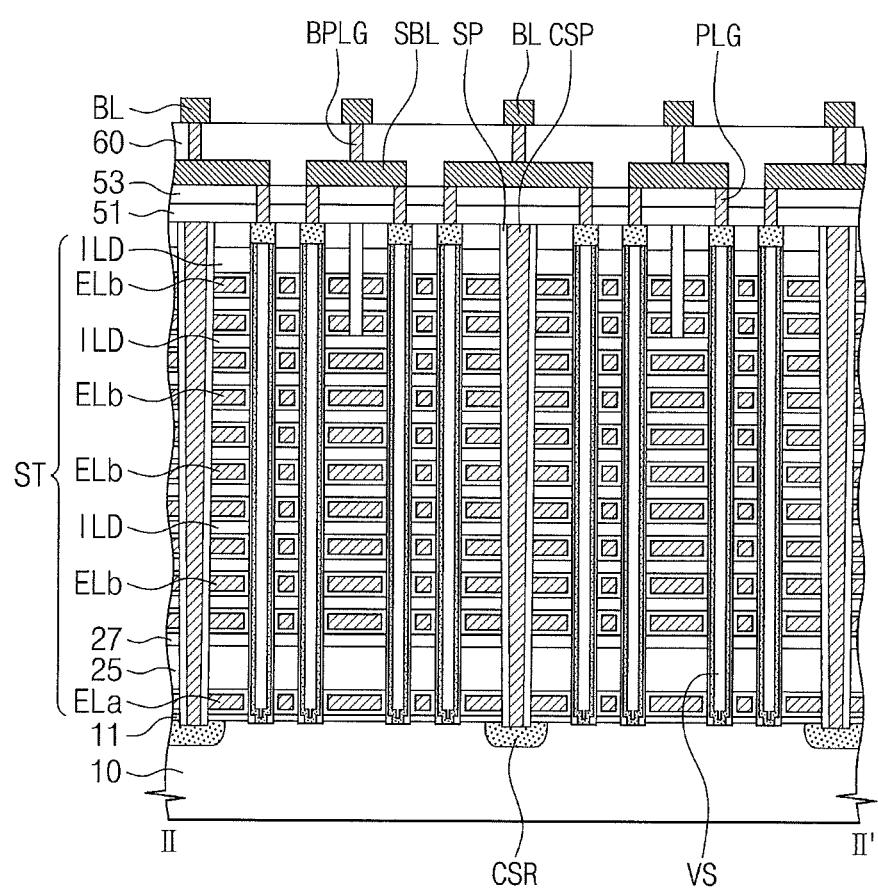
FIGS. 23 and 24 are cross-sections illustrating three-dimensional semiconductor memory devices according to some embodiments of the inventive concept.
Figure 24:
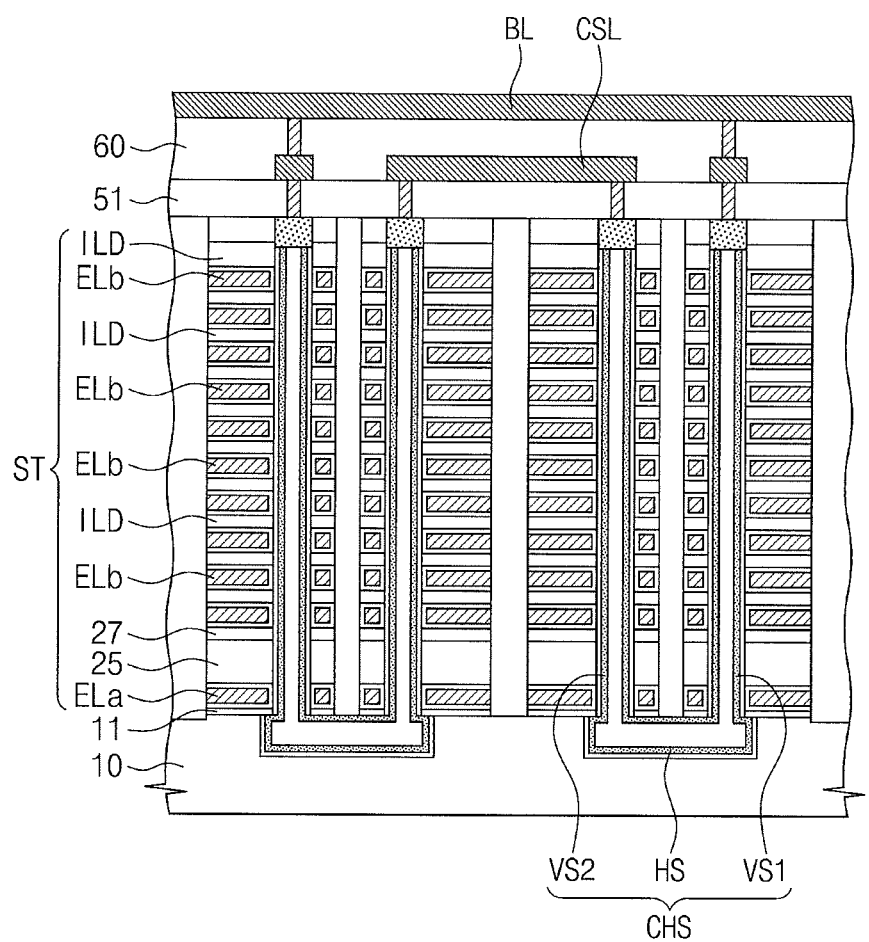

FIGS. 23 and 24 are cross sections illustrating three-dimensional semiconductor memory devices according to some embodiments of the inventive concept. In the interest of brevity, like elements discussed above with respect to FIGS. 4 to 22 may be identified by similar or identical reference numerals and descriptions thereof may not be repeated herein.

Referring first to FIG. 23, the vertical structures VS may penetrate the electrode structures ST on the cell array region CAR and may be electrically connected to the substrate 10. In some embodiments, each of the vertical structures VS may include a semiconductor pattern that is formed to penetrate the electrode structures ST and be in contact with the substrate 10. In these embodiments, the semiconductor pattern may have a hollow pipe shape or a hollow macaroni shape. The semiconductor pattern may have a closed bottom, and an inner space of the semiconductor pattern may be filled with an insulating material. In certain embodiments, the semiconductor pattern may have a circular pillar shape. The semiconductor pattern may have a bottom surface that is positioned at a level lower than a top surface of the substrate 10. For example, the lower semiconductor pattern LSP may be omitted from the vertical structures VS of FIG. 22, and the upper semiconductor pattern USP may be formed to be in direct contact with the substrate 10.

Referring to FIG. 24, on the cell array region CAR, channel structures CHS may be provided to penetrate the electrode structure ST. In some embodiments, each of the channel structures CHS may include first and second vertical channels VS1 and VS2, which are provided to penetrate the electrode structure ST, and a horizontal channel HS, which is provided below the electrode structure ST to connect the first and second vertical channels VS1 and VS2. The first and second vertical channels VS1 and VS2 may be provided in vertical holes that are formed to penetrate the electrode structure ST. The horizontal channel HS may be provided in a recess region, which is formed in an upper portion of the substrate 10. The horizontal channel HS may be provided between the substrate 10 and the electrode structure ST to connect the first and second vertical channels VS1 and VS2 to each other.

In some embodiments, the horizontal channel HS may be a hollow structure, for example, a pipe or a macaroni, which is continuously connected to the first and second vertical channels VS1 and VS2. In other words, the first and second vertical channels VS1 and VS2 and the horizontal channel HS may be connected to form a single pipe-shaped structure. In other words, the first and second vertical channels VS1 and VS2 and the horizontal channel HS may be a single continuous semiconductor pattern that is substantially absent of any interface. In these embodiments, the semiconductor layer may have one of single-crystalline, amorphous, and poly-crystalline structures. Furthermore, as discussed above, a data storing layer may be interposed between the channel structures CHS and the lower and upper electrodes ELa and ELb.

In some embodiments, the first vertical channel VS1 of each channel structure CHS may be connected to the bit line BL, and the second vertical channel VS2 may be connected to the common source line CSL. The channel structures CHS containing a semiconductor material may be electrically disconnected from each other, and an electric potential of each of the channel structures CHS may be controlled by a voltage applied the electrode structure ST. For example, the electric potential of each of the channel structures CHS may be controlled to selectively form a current path between the bit line BL and the common source line CSL.

FIGS. 25 to 31 are cross sections illustrating processing steps in the fabrication of three-dimensional semiconductor memory devices according to some embodiments of the inventive concept. For concise description, an element or step previously described with reference to FIGS. 4 to 22 may be identified by a similar or identical reference number without repeating an overlapping description thereof.

Figure 25:
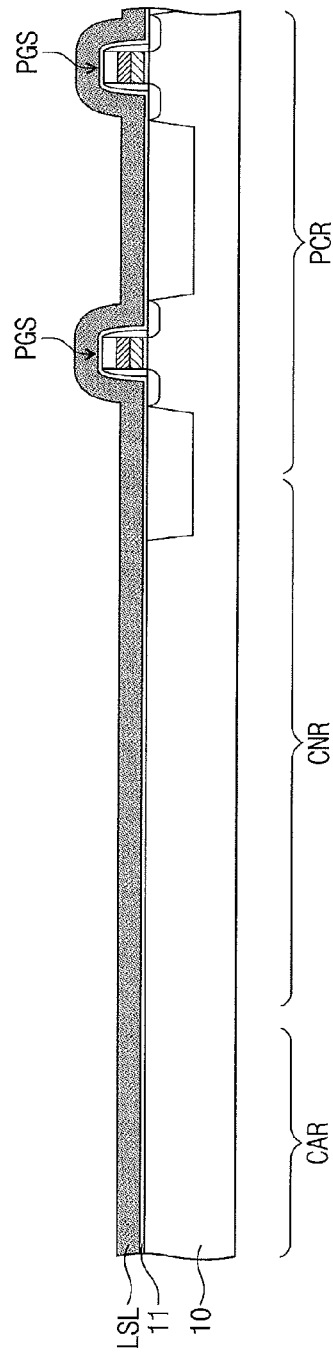

Referring to FIG. 25, the substrate 10 may include the cell array region CAR, the connection region CNR, and the peripheral circuit region PCR, and the peripheral structure may be formed on the peripheral circuit region PCR of the substrate 10.

The peripheral structure may include the peripheral gate stacks PGS that are provided on the peripheral circuit region PCR of the substrate 10 and are spaced apart from each other. In some embodiments, a space between the peripheral gate stacks PGS may be greater than that between the peripheral gate stacks PGS described with reference to FIGS. 4 to 22. In other words, the top surface of the substrate 10 may be exposed between adjacent ones of the peripheral gate stacks PGS.

The insulating buffer layer 11 and the lower sacrificial layer LSL may be sequentially formed on the substrate 10 provided with the peripheral structure. Each of the insulating buffer layer 11 and the lower sacrificial layer LSL may be formed to have a substantially uniform thickness and to conformally cover the peripheral gate stacks PGS and the substrate 10. In these embodiments, the lower sacrificial layer LSL may be formed to have a thickness smaller than that of the peripheral gate stack PGS.

Figure 26:
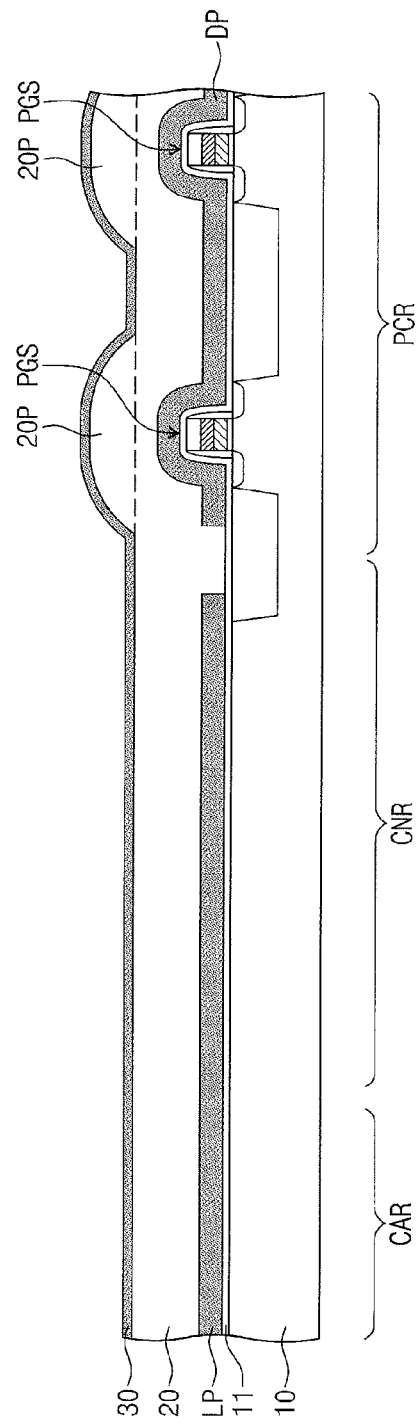

Referring to FIG. 26, the lower sacrificial layer LSL may be patterned to form the lower sacrificial pattern LP and the dummy sacrificial pattern DP. Thereafter, the lower insulating layer 20 and the etch stop layer 30 may be sequentially deposited on the substrate 10. The lower insulating layer 20 may be formed to have a uniform thickness and to conformally cover the lower sacrificial pattern LP and the dummy sacrificial pattern DP.

In some embodiments, the lower insulating layer 20 may have a substantially flat top surface on the cell array region CAR. Due to a difference in height between top surfaces of the peripheral gate stack PGS and the substrate 10, the top surface of the lower insulating layer 20 may have a difference in height between the cell array region CAR and the peripheral circuit region PCR. A top surface level of the lower insulating layer 20 between the peripheral gate stacks PGS may be different from a top surface level of the lower insulating layer 20 on the peripheral gate stacks PGS. In other words, the lower insulating layer 20 may have a plurality of protruding portions 20P that are provided on the peripheral circuit region PCR and are spaced apart from each other.

Figure 27:
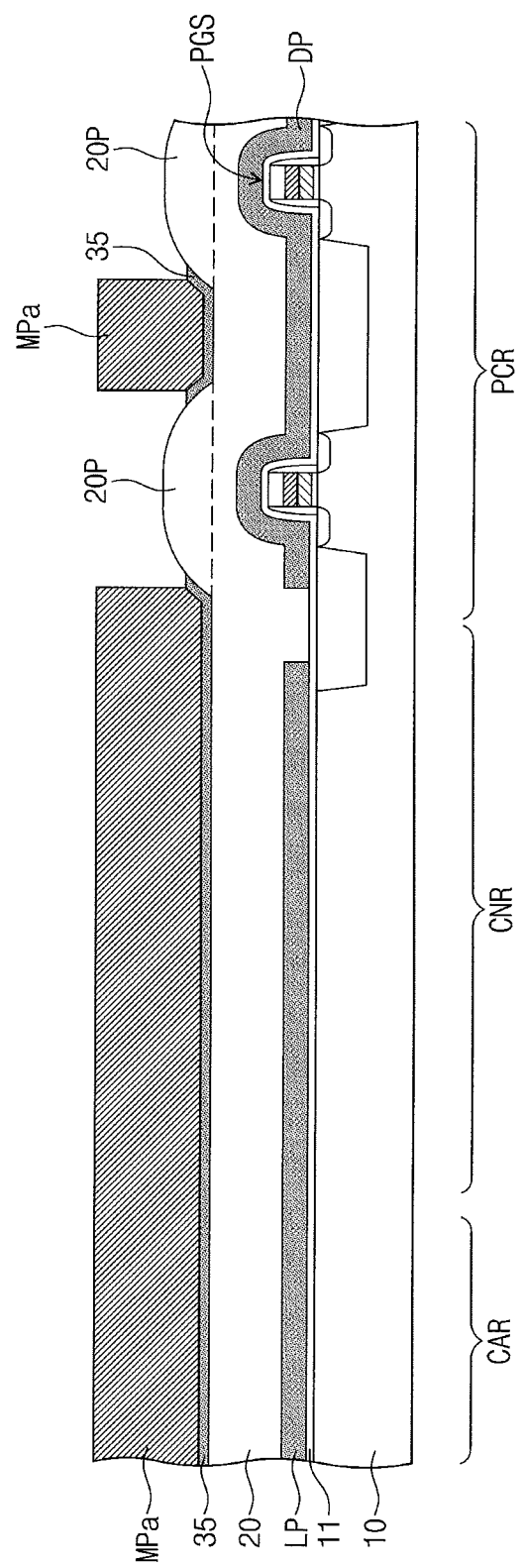

Referring to FIG. 27, the mask pattern MPa may be formed on the etch stop layer 30, and the mask pattern MPa may have openings, which are formed on regions corresponding to the protruding portions 20P of the lower insulating layer 20 or the peripheral gate stacks PGS. In other words, the mask pattern MPa may include a portion that is formed on the peripheral circuit region PCR and between the protruding portions 20P of the lower insulating layer 20.

Thereafter, the etch stop layer 30 may be anisotropically etched using the mask pattern MPa as an etch mask, thereby forming the etch stop pattern 35. In some embodiments, the etch stop pattern 35 may be formed to cover the top surface of the lower insulating layer 20 on the cell array region CAR and the connection region CNR and to cover the top surface of the lower insulating layer 20, which is positioned between the peripheral gate stacks PGS, on the peripheral circuit region PCR. The mask pattern MPa may be removed, after the formation of the etch stop pattern 35.

Referring to FIG. 28, a planarization process may be performed on the lower insulating layer 20 to remove the protruding portions 20P of the lower insulating layer 20. As a result, it may be possible to reduce a difference in height between top surfaces of portions of the lower insulating layer 20 that are positioned on the cell array region CAR and the peripheral circuit region PCR. The planarization process may be performed using a CMP process, and the etch stop pattern 35 may be used as a termination point in the CMP process. Accordingly, it may be possible to prevent a thickness of any other portion of the lower insulating layer 20, except for the protruding portions 20P, from being changed.

After the planarization process, a process may be performed to remove the etch stop pattern 35 remaining on the lower insulating layer 20. Accordingly, when the planarization process is finished, the lower insulating layer 20 may have a substantially flat top surface, and a thickness of the lower insulating layer 20 may be smaller on the peripheral circuit region PCR than on the cell array region CAR.

Referring to FIG. 29, a recess process may be performed on a top surface of the planarized lower insulating layer 21 to reduce a thickness of the planarized lower insulating layer 21. Accordingly, the lower insulating planarized layer 25 may be formed to have a substantially flat top surface on the cell array region CAR and to expose the dummy sacrificial pattern DP.

As an example, the lower insulating planarized layer 25 may have a substantially uniform thickness on the cell array region CAR and the connection region CNR and may have a substantially flat top surface. Furthermore, the lower insulating planarized layer 25 may include a portion remaining on the peripheral circuit region PCR, for example, on the dummy sacrificial pattern DP between the peripheral gate stacks PGS. A top surface of the lower insulating planarized layer 25 may be substantially coplanar with or lower than the uppermost surface of the dummy sacrificial pattern DP.

Figure 31:
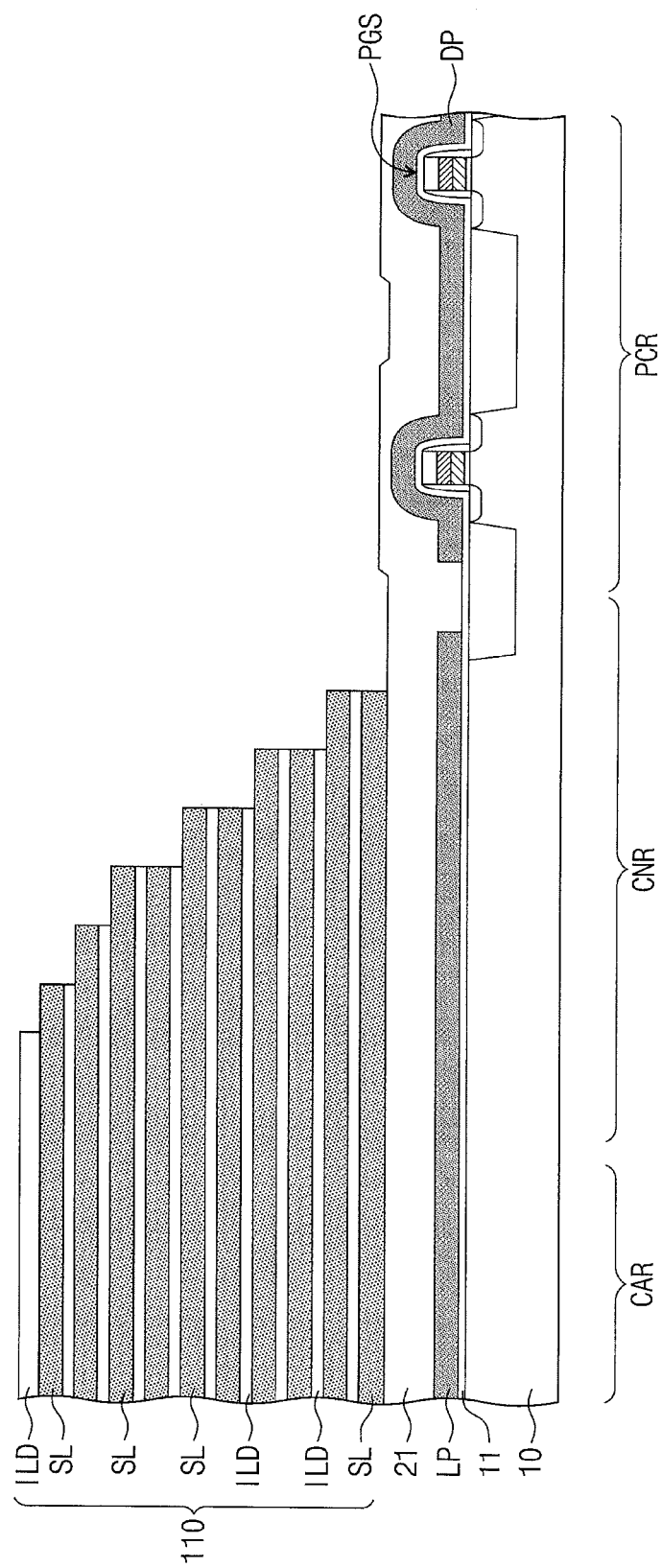

In certain embodiments, the recessing process on the top surface of the planarized lower insulating layer 21 may be omitted, and the dummy sacrificial pattern DP may be covered with the planarized lower insulating layer 21, as shown in FIG. 31.

Figure 30:
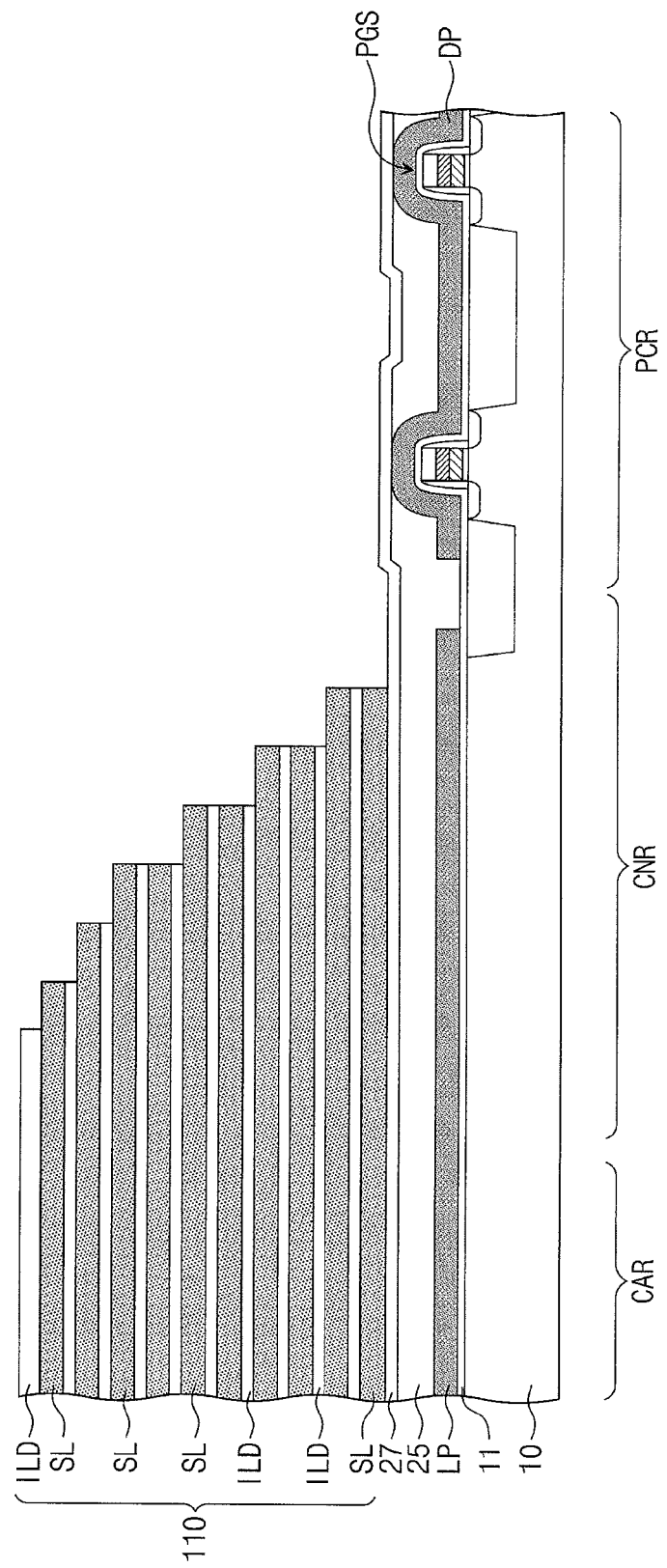

Referring to FIG. 30, the dummy insulating layer 27 may be formed on the lower insulating planarized layer 25, as described with reference to FIG. 10. The dummy insulating layer 27 may be formed to cover top surfaces of the lower insulating planarized layer 25 and the dummy sacrificial pattern DP. The dummy insulating layer 27 may have a substantially flat top surface on the cell array region CAR and the connection region CNR, as described above.

The mold structure 110 may be formed on the dummy insulating layer 27. The mold structure 110 may include the upper sacrificial layers SL and the upper insulating layers ILD that are vertically and alternately stacked on the dummy insulating layer 27. In some embodiments, the formation of the mold structure 110 may include forming the layered structure 100 on the dummy insulating layer 27 and trimming the layered structure 100, as previously described with reference to FIGS. 11 and 12.

In some embodiments, the mold structure 110 may be formed on the cell array region CAR and the connection region CNR and may expose the dummy insulating layer 27 on the peripheral circuit region PCR.

In embodiments where, as shown in FIG. 31, the dummy insulating layer 27 is omitted, the mold structure 110 may be formed to expose the lower insulating planarized layer 25 and the dummy sacrificial pattern DP on the peripheral circuit region PCR.

As described with reference to FIGS. 13 to 20, a replacement process may be performed to replace the upper sacrificial layers SL and the lower sacrificial pattern LP of the mold structure 110 with the upper electrodes ELb and the lower electrode ELa, respectively, and the vertical structures VS may be formed to penetrate the lower electrode ELa and the upper electrodes ELb.

FIGS. 32 to 37 are cross sections illustrating processing steps in the fabrication of a three-dimensional semiconductor memory device according to some embodiments of the inventive concept. In the interest of brevity, an element or step previously described with reference to FIGS. 4 to 22 may be identified by a similar or identical reference numeral without repeating an overlapping description thereof.

Figure 32:
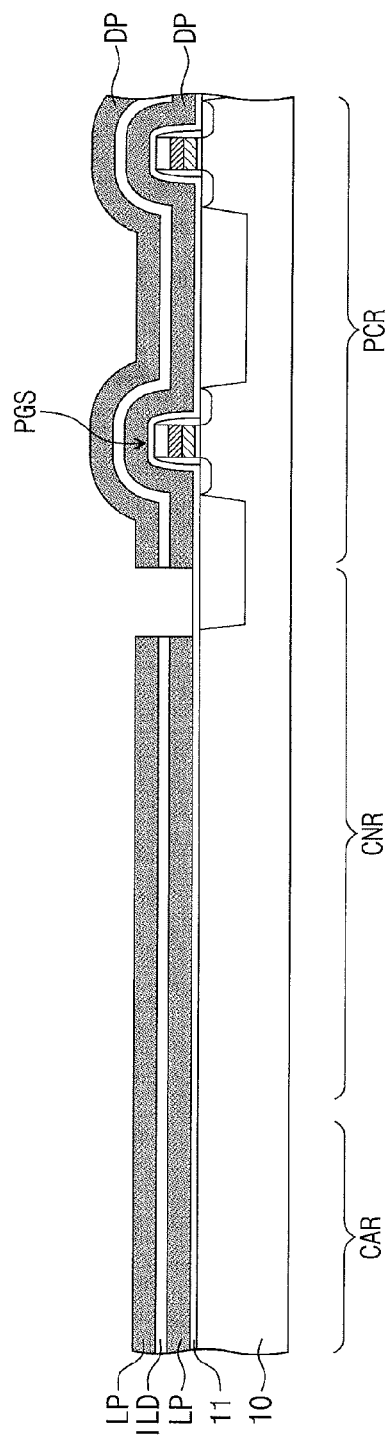
FIGS. 32 to 37 are cross-sections illustrating processing steps in the fabrication of three-dimensional semiconductor memory devices according to some embodiments of the inventive concept.

Referring to FIG. 32, the peripheral structure may be formed on the peripheral circuit region PCR of the substrate 10, and a plurality of lower sacrificial layers LSL may be stacked on the substrate 10. In some embodiments, an insulating layer ILD may be interposed between the lower sacrificial layers LSL. Thereafter, the plurality of lower sacrificial layers LSL and the insulating layer ILD may be patterned. As a result, a plurality of lower sacrificial patterns LP, which are vertically spaced apart from each other by the insulating layer ILD, may be formed on the cell array region CAR of the substrate 10, and a plurality of dummy sacrificial patterns DP, which are vertically spaced apart from each other by the insulating layer ILD, may be formed on the peripheral structure of the peripheral circuit region PCR. Due to the presence of the peripheral gate stacks PGS, the lower sacrificial pattern LP and the dummy sacrificial pattern DP may have top surfaces that are positioned at different levels.

Figure 33:
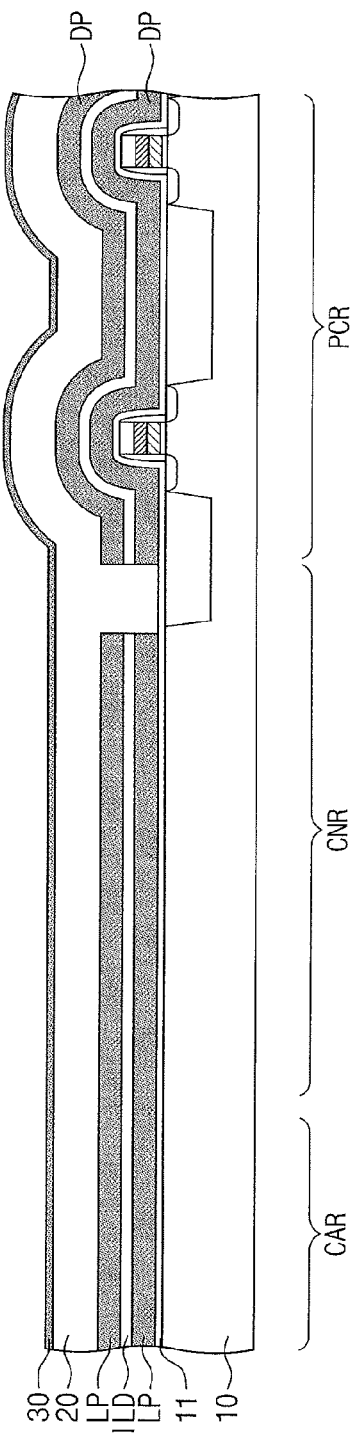

Referring to FIG. 33, the lower insulating layer 20 and the etch stop layer 30 may be sequentially formed on the lower sacrificial patterns LP and the dummy sacrificial patterns DP. The lower insulating layer 20 may be deposited to have a uniform thickness, and thus, the lower insulating layer 20 may have protruding portions 20P formed on the peripheral circuit region PCR.

Figure 34:
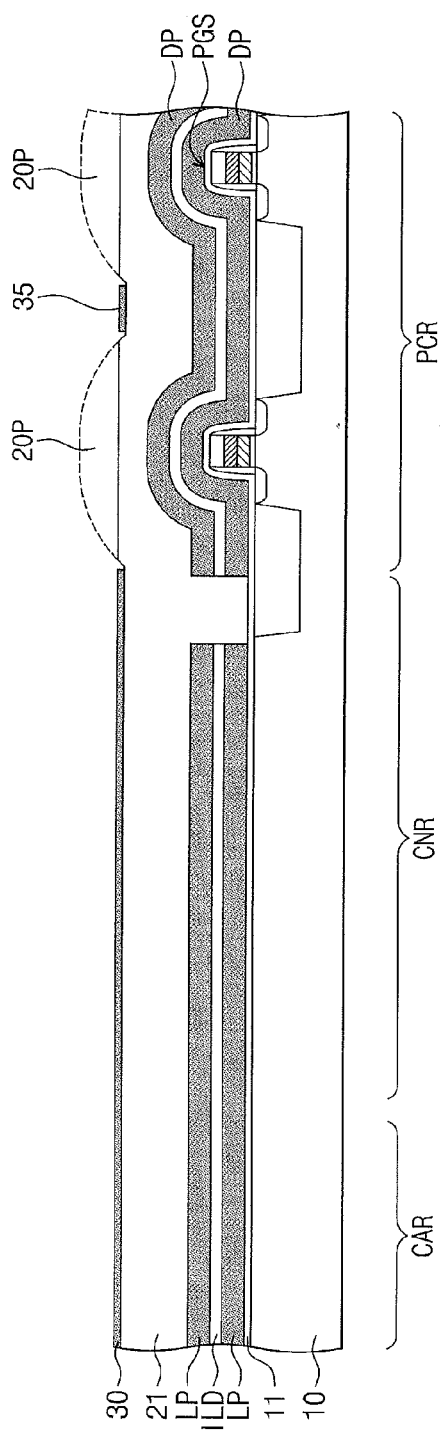

Referring to FIG. 34, the etch stop layer 30 may be patterned to form the etch stop pattern 35 exposing the protruding portions 20P of the lower insulating layer 20. Thereafter, a planarization process, in which the etch stop pattern 35 is used as a polishing stop layer, may be performed on the lower insulating layer 20, and thus, a planarized lower insulating layer 21 may be formed. A thickness of the planarized lower insulating layer 21 may be smaller on the peripheral circuit region PCR than on the cell array region CAR.

Figure 35:
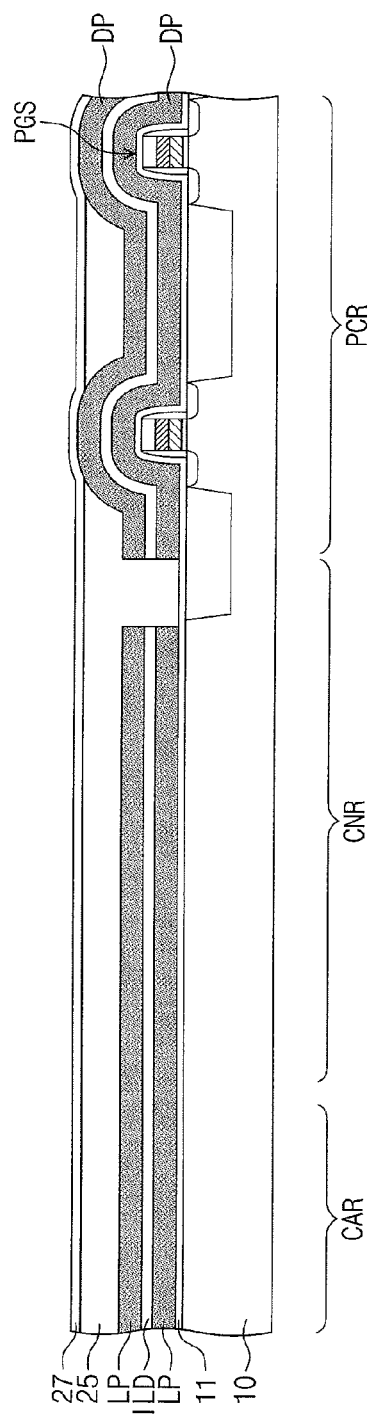

Referring to FIG. 35, the top surface of the planarized lower insulating layer 21 may be recessed to expose a top surface of the uppermost one of the dummy sacrificial patterns DP, and as a result, the lower insulating planarized layer 25 may be formed. The dummy insulating layer 27 may be formed on the substrate 10 to cover the lower insulating planarized layer 25 and the uppermost one of the dummy sacrificial patterns DP.

Figure 36:
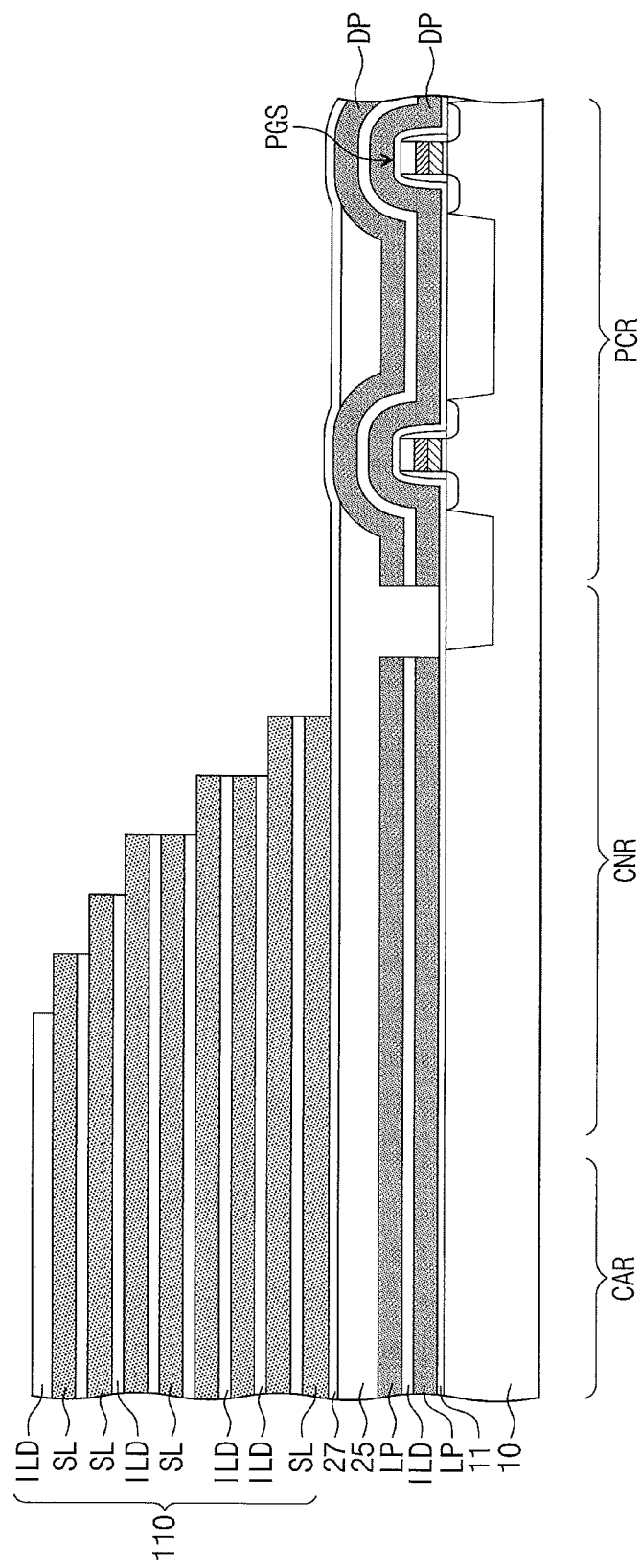

Referring to FIG. 36, the mold structure 110 may be formed on the dummy insulating layer 27. The mold structure 110 may include the upper sacrificial layers SL and the upper insulating layers ILD that are vertically and alternatingly stacked on the dummy insulating layer 27. In some embodiments, the formation of the mold structure 110 may include forming the layered structure 100 on the dummy insulating layer 27 and trimming the layered structure 100, as previously described with reference to FIGS. 11 and 12. In some embodiments, the mold structure 110 may be formed on the cell array region CAR and the connection region CNR and may expose the dummy insulating layer 27 on the peripheral circuit region PCR.

Figure 37:
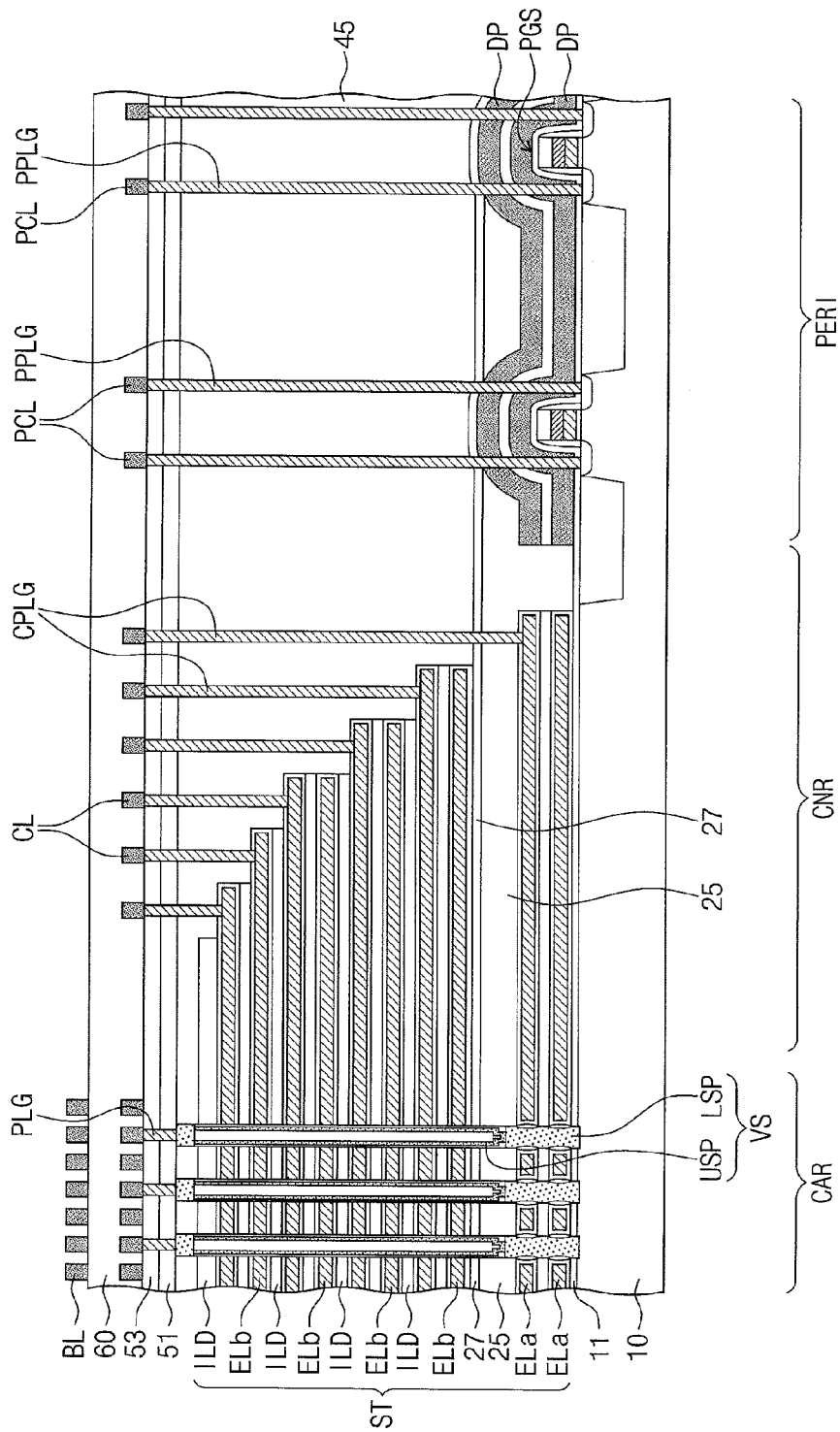

Referring to FIG. 37, as described with reference to FIGS. 13 to 20, the upper and lower sacrificial patterns SL and LP of the mold structure 110 may be replaced with the upper and lower electrodes ELb and ELa, respectively, and as a result, the electrode structure ST may be formed on the cell array region CAR. The vertical structures VS may be formed to penetrate the lower electrodes ELa and the upper electrodes ELb.

Thereafter, as described with reference to FIG. 19, the contact plugs PLG, the cell contact plugs CPLG, and the peripheral contact plugs PPLG may be formed on the cell array region CAR, the connection region CNR, and the peripheral circuit region PCR, respectively. According to some embodiments of the present inventive concept, the peripheral contact plugs PPLG may penetrate a plurality of the dummy sacrificial patterns DP.

As discussed briefly above, according to some embodiments of the inventive concept, a lower insulating layer may be provided to cover a peripheral structure on a peripheral circuit region of a substrate. The lower insulating layer may be extended between vertically adjacent electrodes that are provided on a cell array region of the substrate.

In some embodiments, a process of removing the lower insulating layer covering the peripheral structure from the cell array region may be omitted, and electrodes and upper insulating layers may be alternatingly stacked on a planarized lower insulating layer. This may make it possible to simplify a method of fabricating a three-dimensional semiconductor device and thereby to reduce a fabrication cost of the three-dimensional semiconductor device.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a three-dimensional semiconductor device, comprising:
providing a substrate with a peripheral circuit region and a cell array region;
forming a peripheral structure on the peripheral circuit region of the substrate;
sequentially forming a lower sacrificial layer and a lower insulating layer to cover the peripheral structure and the cell array region of the substrate, the lower insulating layer including a protruding portion on the peripheral structure;
forming an etch stop pattern to cover a top surface of the lower insulating layer on the cell array region and to expose the protruding portion of the lower insulating layer;
performing a planarization process on the protruding portion of the lower insulating layer to form a lower insulating planarized layer, the planarization process being performed using the etch stop pattern as an etch stop layer;
removing the etch stop pattern; and forming a mold structure on the cell array region, the mold structure comprising upper sacrificial layers and upper insulating layers that are vertically and alternatingly stacked on the lower insulating planarized layer.

2. The method of claim 1, wherein a top surface of the peripheral structure is positioned between a top surface of the lower sacrificial layer and a bottom surface of the lowermost one of the upper sacrificial layers.

3. The method of claim 1, wherein the peripheral structure has a first thickness, and the lower sacrificial layer has a second thickness, smaller than the first thickness.

4. The method of claim 3, wherein the lower insulating layer has a third thickness, the third thickness being greater than a sum of the first and second thicknesses.

5. The method of claim 1, wherein a top surface of the lower sacrificial layer is lower on the cell array region than on the peripheral circuit region.

6. The method of claim 5, wherein, on the peripheral circuit region, a top surface of the lower insulating planarized layer is substantially coplanar with or lower than the top surface of the lower sacrificial layer.

7. The method of claim 1, further comprising replacing a portion of the lower sacrificial layer with a lower electrode and replacing the upper sacrificial layers with upper electrodes, on the cell array region.

8. The method of claim 1, wherein forming of the mold structure is preceded by:
recessing a top surface of the lower insulating planarized layer to expose a portion of the lower sacrificial layer on the peripheral circuit region; and
forming a dummy insulating layer on the recessed lower insulating planarized layer,
wherein the dummy insulating layer is formed to cover the exposed portion of the lower sacrificial layer.

9. The method of claim 1, further comprising patterning the lower sacrificial layer to form a dummy sacrificial pattern on the peripheral circuit region and a lower sacrificial pattern on the cell array region, the dummy sacrificial pattern covering the peripheral structure, before the forming of the lower insulating layer,
wherein the lower insulating layer is formed to conformally cover the dummy sacrificial pattern and the lower sacrificial pattern.

10. The method of claim 1:
wherein the forming of the peripheral structure comprises forming peripheral gate stacks that are spaced apart from each other on the peripheral circuit region of the substrate; and
wherein the lower sacrificial layer and the lower insulating layer are formed to conformally cover the peripheral gate stacks.

11. The method of claim 10, wherein the lower insulating planarized layer remains between the peripheral gate stacks and on the lower sacrificial layer.

12. The method of claim 1, further comprising:
forming an insulating gapfill layer on the lower insulating planarized layer to cover the mold structure, the insulating gapfill layer comprising a protruding portion on the cell array region;
patterning the insulating gapfill layer to etch the protruding portion of the insulating gapfill layer; and
performing a planarization process on the patterned insulating gapfill layer to form an insulating planarization gapfill layer.

13. The method of claim 12, wherein, on the peripheral circuit region, a top surface of the insulating gapfill layer is positioned at a level higher than that of a top surface of the mold structure.

14. A method of fabricating a three-dimensional semiconductor device, comprising:
providing a substrate with a peripheral circuit region and a cell array region;
forming a peripheral structure on the peripheral circuit region of the substrate;
forming an electrode structure on the cell array region of the substrate, the electrode structure comprising a lower electrode, a lower insulating planarized layer on the lower electrode, and upper electrodes and upper insulating layers vertically and alternatingly stacked on the lower insulating planarized layer, the lower insulating planarized layer being extended to cover the peripheral structure on the peripheral circuit region; and
forming an upper insulating planarized layer to cover the electrode structure and the lower insulating planarized layer on the peripheral circuit region.

15. A method of fabricating a three-dimensional semiconductor device, comprising:
providing a substrate having a peripheral circuit region and a cell array region;
forming a peripheral structure on the peripheral circuit region of the substrate;
sequentially forming a first sacrificial layer and a first insulating layer to cover the peripheral structure and the cell array region of the substrate, at least a portion of the first insulating layer protruding from the peripheral structure;
forming an etch stop pattern to cover a top surface of the first insulating layer on the cell array region and to expose the protruding portion of the first insulating layer;
planarizing the protruding portion of the first insulating layer using the etch stop pattern as an etch stop layer to provide a first insulating planarized layer; and
forming a mold structure on the cell array region, the mold structure comprising second sacrificial layers and second insulating layers that are vertically and alternatingly stacked on the first insulating planarized layer.

16. The method of claim 15, wherein forming the mold structure is preceded by removing the etch stop pattern.

17. The method of claim 15, wherein a top surface of the peripheral structure is positioned between a top surface of the first sacrificial layer and a bottom surface of a lowermost one of the second sacrificial layers.

18. The method of claim 15:
wherein the peripheral structure has a first thickness; and
wherein the first sacrificial layer has a second thickness, smaller than the first thickness.

19. The method of claim 18, wherein the first insulating layer has a third thickness, the third thickness being greater than a sum of the first and second thicknesses.

20. The method of claim 15, wherein a top surface of the first sacrificial layer is lower on the cell array region than on the peripheral circuit region.

* * * * *